(12) United States Patent
Kim et al.

(10) Patent No.: US 7,394,160 B2
(45) Date of Patent: Jul. 1, 2008

(54) PRINTED WIRES ARRANGEMENT FOR IN-LINE MEMORY (IMM) MODULE

(75) Inventors: Moon-Jung Kim, Suwon-si (KR); Jong-Joo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/227,161

(22) Filed: Sep. 16, 2005

(65) Prior Publication Data
US 2006/0170097 A1 Aug. 3, 2006

(30) Foreign Application Priority Data
Feb. 2, 2005 (KR) .................. 10-2005-0009709

(51) Int. Cl.
*H01L 23/48* (2006.01)
(52) U.S. Cl. .................. 257/774; 257/686; 257/723; 257/724; 257/780
(58) Field of Classification Search .......... 257/723, 257/774, 734, 773, 686, 724, 780; 174/50; 361/729, 730; 438/107–109
See application file for complete search history.

(56) References Cited

U.S. PATENT DOCUMENTS

| | | | |
|---|---|---|---|
| 5,130,894 A | 7/1992 | Miller | |
| 6,188,133 B1 * | 2/2001 | Shizuno | 257/734 |
| 6,307,769 B1 * | 10/2001 | Nuxoll et al. | 365/63 |
| 6,433,422 B1 | 8/2002 | Yamasaki | |
| 6,667,895 B2 | 12/2003 | Jang et al. | |
| 6,818,983 B2 | 11/2004 | Shiomi | |
| 2003/0011391 A1 | 1/2003 | Brunelle et al. | |
| 2003/0089978 A1 * | 5/2003 | Miyamoto et al. | 257/723 |
| 2005/0007807 A1 * | 1/2005 | Martin et al. | 365/63 |

(Continued)

FOREIGN PATENT DOCUMENTS

DE        19928075        1/2000

(Continued)

OTHER PUBLICATIONS

British Patent Office Action dated May 24, 2006, for corresponding British Patent Application No. GB0602139.8.

(Continued)

*Primary Examiner*—Jerome Jackson
*Assistant Examiner*—Jami M Valentine
(74) *Attorney, Agent, or Firm*—Harness, Dickey & Pierce, PLC

(57) ABSTRACT

An inline memory module (IMM) architecture may include: a printed circuit board (PCB); a first array of memory devices on a first side of the PCB; a second array of memory devices on a second side of the PCB; at least some of the memory devices of the first array being arranged so as to substantially overlap, relative to a reference axis of the PCB, positional-twin memory devices of the second array, respectively; and multiple vias at least some of which are parts of respective signal paths that connect signal leads of a first memory device in the first array to corresponding signal leads of a second memory device in the second array that is adjacent to a positional-twin third memory device in the second array corresponding to the first memory device.

20 Claims, 20 Drawing Sheets

U.S. PATENT DOCUMENTS

2005/0195629 A1* 9/2005 Leddige et al. .............. 365/51
2006/0044083 A1 3/2006 Kuzmenka

FOREIGN PATENT DOCUMENTS

| | | |
|---|---|---|
| JP | 3049255 | 3/1991 |
| JP | 10-199909 | 7/1998 |
| JP | 11-026900 | 1/1999 |
| JP | 11-251516 | 9/1999 |
| JP | 2001-358285 | 12/2001 |
| JP | 2003-051545 | 2/2003 |
| KR | 2002-0064525 | 8/2002 |
| KR | 10-2002-0064525 A | 9/2002 |
| WO | WO2005/093757 | 10/2005 |

OTHER PUBLICATIONS

German Patent Office Action dated Mar. 30, 2006, for corresponding German Patent Application No. 10 2006 005 955.7-33.

* cited by examiner

FIG. 2A (BACKGROUND ART)
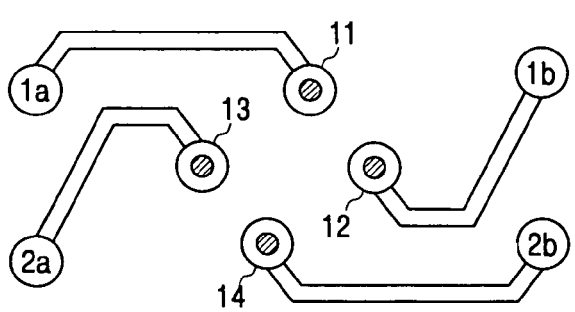
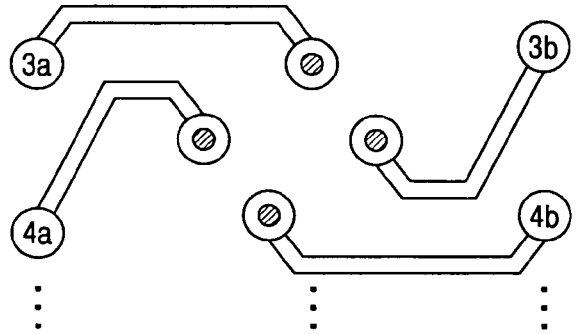
FIG. 2B (BACKGROUND ART)
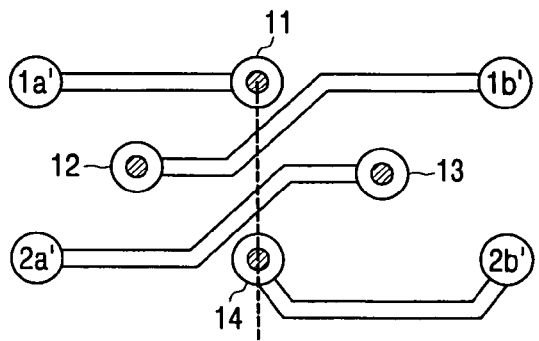
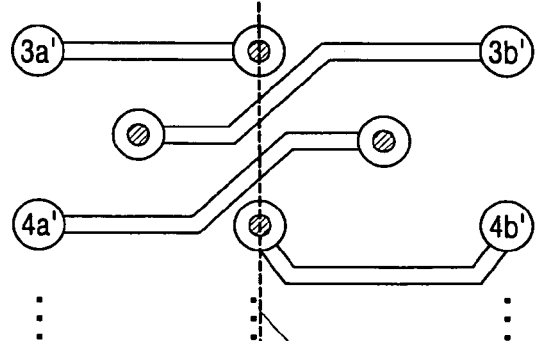
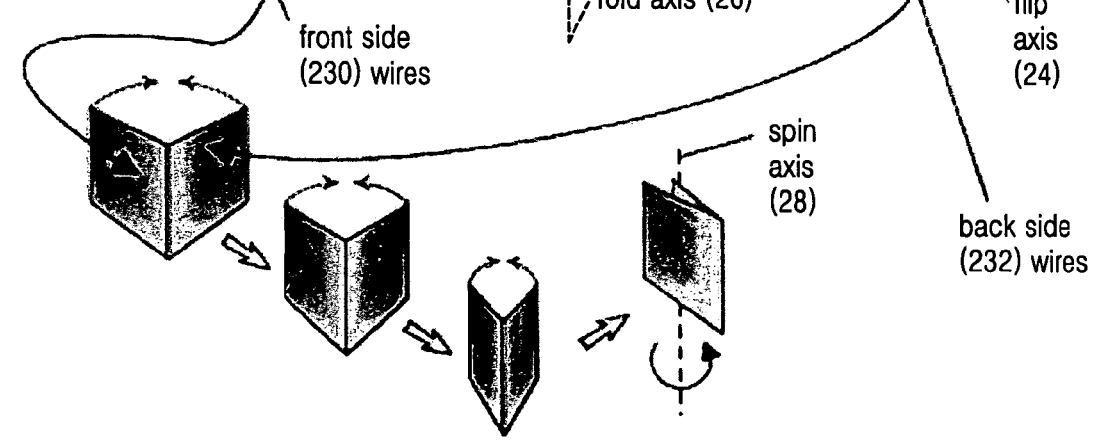
front side (230) wires
fold axis (26)
flip axis (24)
spin axis (28)
back side (232) wires

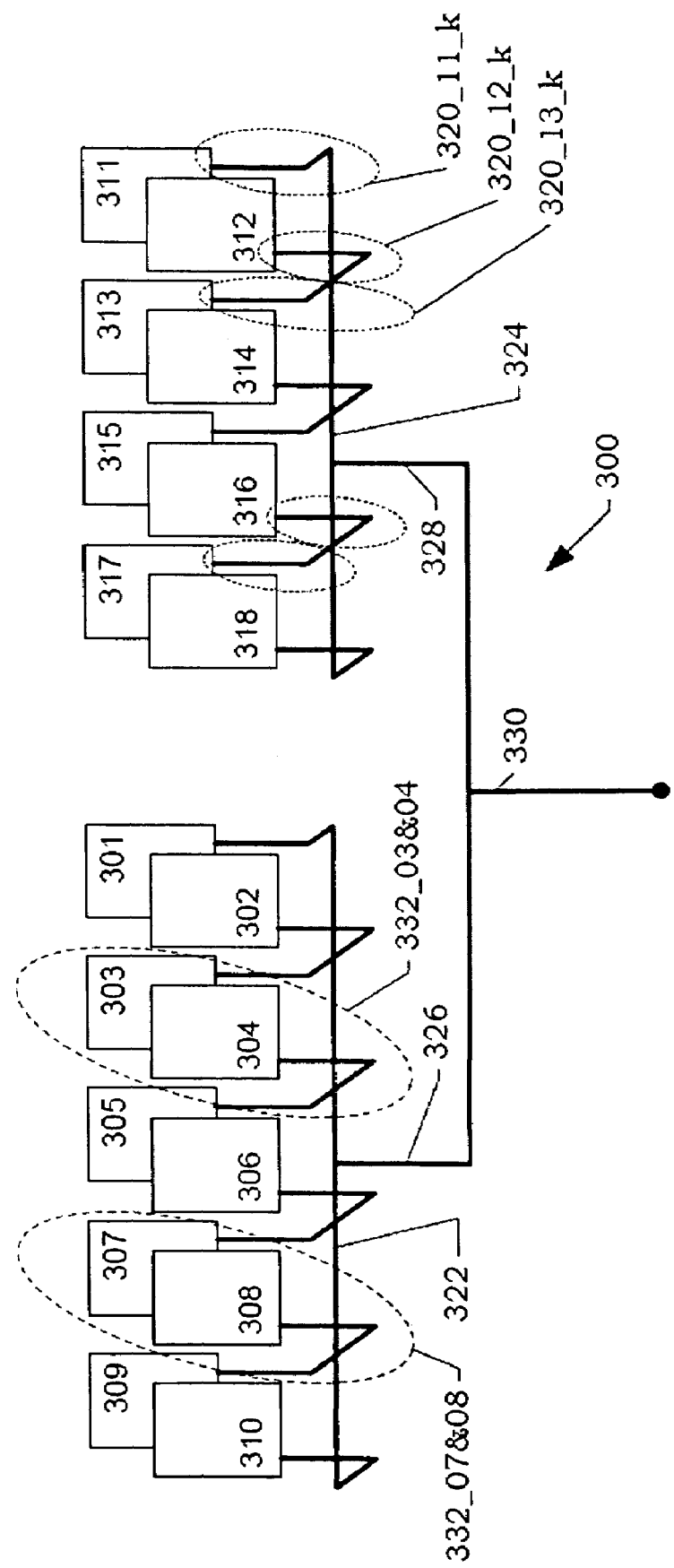

PRINTED WIRES ARRANGEMENT FOR IN-LINE MEMORY (IMM) MODULE

PRIORITY INFORMATION

This application claims the benefit of Korean Patent Application No. 2005-0009709, filed on Feb. 2, 2005, in the Korean Intellectual Property Office, the disclosure of which is incorporated herein in its entirety by reference.

BACKGROUND OF THE PRESENT INVENTION

Memory modules can be characterized by form factor. The form factor for any memory module describes its size and pin configuration. An example of an older form factor for memory modules is the SIMM type, where SIMM is an acronym for single in-line memory module. A newer form factor is the DIMM type, where DIMM is an acronym for dual in-line memory module. There are several variations of DIMMs, with new variations continuing to evolve.

FIG. 1A is a cross-section of a DIMM 100, according to the Background Art, taken along section line $I_A$-$I_A{}'$ shown in FIGS. 1B and 1C.

DIMM 100 includes: a printed circuit board (PCB) 102; and integrated circuit memory devices 104_$i$ (e.g., 104_1, 104_2, 104_3 and 104_4). Typically, the integrated circuit memory devices are packaged devices, each of which contains one or more integrated circuit chips. For example, the packaged devices may be in form of plastic leaded packages, BGA (ball grid array) packages, and WFPs (wafer-level fabricated packages), etc. It is assumed in FIG. 1A that the integrated circuit memory devices are in form of BGA packages. PCB 102 has a front side 130 and a back side 132. Conductive segments (hereafter referred to as wires) are printed on front side 130 and back side 132 of PCB 102. More particularly, wires 116, 118, 124 and 126 are visible in FIG. 1A on front side 130 of PCB 102, and wires 114, 120, 122 and 128 are visible in FIG. 1A on back side 132 of PCB 102. The vias are formed in PCB 102, of which vias 108_6 and 110_7 are visible in FIG. 1A. Conductive terminals 106 of memory devices 104_$i$, e.g. conductive balls in the circumstance of a BGA package, connect conductive I/O terminals of the circuits (not shown) in memory devices 104_$i$ to the various wires on PCB 102.

Relative to a reference axis, e.g., the longitudinal axis of PCB 102, memory devices 104_1 and 104_2 align at a first reference location so as to overlap each other. Similarly, memory devices 104_3 and 104_4 align at a second reference location so as to overlap each other. To simplify description, memory devices 104_1 & 104_2 will be referred to as positional-twins. Similarly, memory devices 104_3 and 104_4 will be referred to as positional-twins.

FIG. 1B is a front view of the printed wires and vias of PCB 102 that fall within the overlying footprints 134 of memory devices 104_1 and 104_2, according to the Background Art. FIG. 1C is a front view of the printed wires and vias of PCB 102 that fall within the overlying footprints 136 of memory devices 104_3 and 104_4, according to the Background Art.

In FIG. 1B, vias 108_1, 108_2, . . . , 108_4 are called out. Similarly, in FIG. 1C, vias 110_1, 110_2, . . . , 110_4 are called out. In FIGS. 1B and 1C, wires on front side 130 of PCB 102 as well as wires on back side 132 of PCB 102 are visible. For simplicity of illustration, however, only wires 114, 116, 122 and 124 are called out in FIGS. 1B and 1C, respectively. A fuller understanding of FIGS. 1B & 1C can be facilitated with reference to FIGS. 2A-2C.

FIG. 2A is a front view of the printed wires and vias on front side 230 of a PCB (not depicted) in a DIMM (not depicted) that fall within the overlying footprint of a memory device (not depicted), according to the Background Art. FIG. 2B is a back-side view of the printed wires and vias on a back side 232 of the same PCB in the same DIMM that fall within the overlying footprint of a positional-twin memory device (not depicted), according to the Background Art. FIG. 2C is a front view of the printed wires and vias of the PCB that fall within the overlapped footprints of the positional-twin memory devices, according to the Background Art. FIGS. 2A-2C (again) are provided to help relate FIGS. 1B and 1C to FIG. 1A.

A description of how FIG. 2C is obtained can be as follows: rotate FIG. 2B 180° about a flip axis 24; and then superimpose FIG. 2A upon the rotated version of FIG. 2B. Alternatively, a description of how FIG. 2C is obtained can be as follows: make a left-hand rotation of FIG. 2A about a fold axis 26 and make a right-hand rotation of FIG. 2B about fold axis 26, bringing FIG. 2A toward FIG. 2B as one might close a book or fold a sheet of paper; and then make a right-hand rotation of the closed-book/folded-sheet until the wires in the closed-book/folded-sheet corresponding to the wires in FIG. 2A have the same orientation as in FIG. 2A.

In FIG. 2C, vias 11 and 12 connect wires 16 & 20 and 22 & 18, respectively. Pads 1$a$ and 1$b'$ (or, in other words, end portions) of wires 16 and 22, respectively, are not electrically connected, but they do overlap (again, given the relationship of FIG. 2C to FIGS. 2A-2B). Hence, in FIG. 2C, one circle encloses both reference numbers 1$a$ and 1$b'$. Similarly, pads 1$a'$ and 1$b$ of wires 20 and 18, respectively, are not electrically connected, but they do overlap. Accordingly, in FIG. 2C, one circle encloses both reference numbers 1$a'$ and 1$b$.

Returning to FIGS. 1A-1B, conductive terminals 106 can be described as being clustered along opposing edges of each memory device 104_$i$. In contrast and relative to the arrangement of conductive terminals 106, vias 108_$i$ can be described as being clustered along a central axis of each memory device 104_$i$.

SUMMARY OF THE PRESENT INVENTION

An embodiment of the present invention provides an inline memory module (IMM) architecture. Such an IMM architecture may include: a printed circuit board (PCB); a first array of memory devices on a first side of the PCB; a second array of memory devices on a second side of the PCB; at least some of the memory devices of the first array being arranged so as to substantially overlap, relative to a reference axis of the PCB, positional-twin memory devices of the second array, respectively; and multiple vias at least some of which are parts of respective signal paths that connect I/O terminals of a first memory device in the first array to corresponding I/O terminals of a second memory device in the second array that is adjacent to a positional-twin third memory device in the second array corresponding to the first memory device.

BRIEF DESCRIPTION OF THE DRAWINGS

FIG. 2A is a front view of the printed wires and vias on a front side of a PCB (not depicted) in a DIMM (not depicted) that fall within the overlying footprint of an memory device (not depicted), according to the Background Art.

FIG. 2B is a rear view of the printed wires and vias on a back side of the same PCB in the same DIMM as in FIG. 2B that fall within the overlying footprint of a positional-twin memory device (not depicted), according to the Background Art.

FIG. 3 is a block diagram of an in-line memory module (IMM), e.g., a dual IMM (DIMM) of any of the various varieties thereof, according to an embodiment of the present invention.

DETAILED DESCRIPTION OF EXAMPLE EMBODIMENTS

Figure 1A:
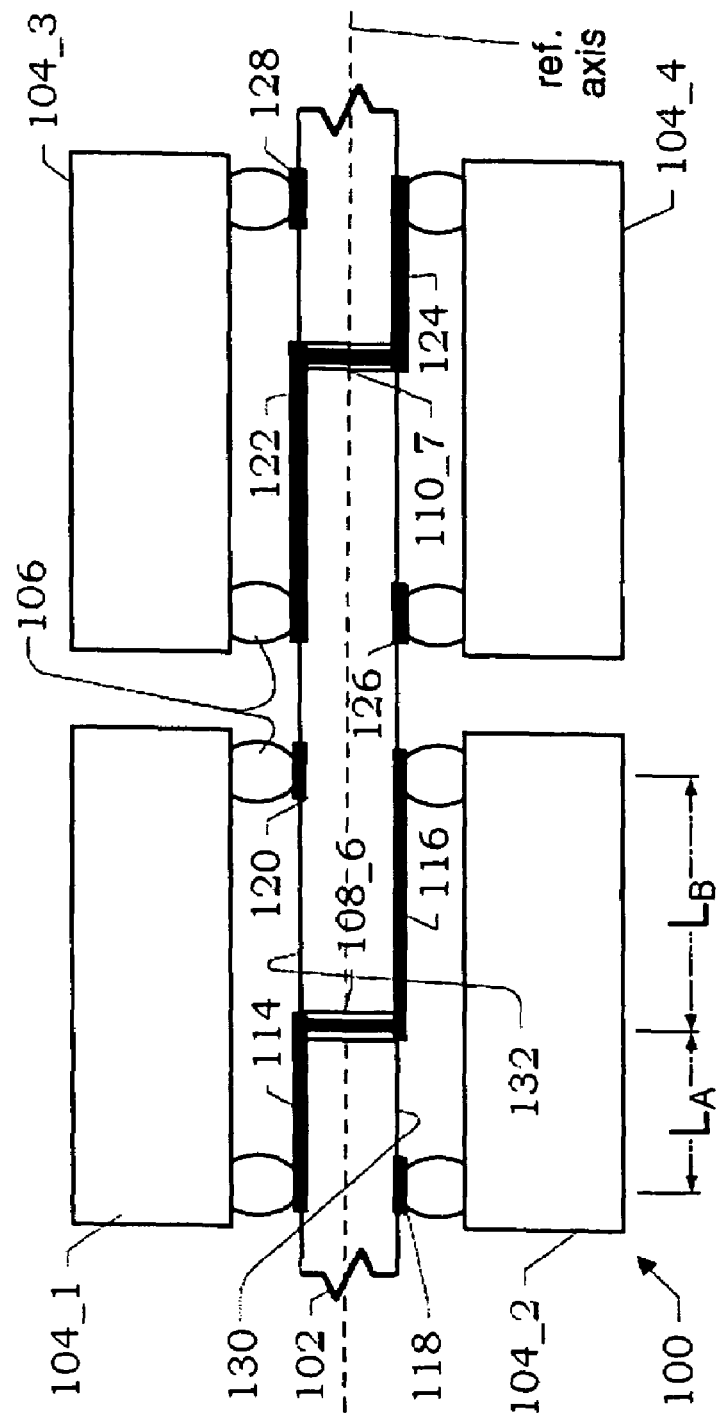
FIG. 1A is a cross-section of a DIMM, according to the Background Art, taken along section line $I_A$-$I_A{}'$ shown in FIGS. 1B and 1C.

The present invention will be described more fully with reference to the accompanying drawings, in which example embodiments of the present invention are shown. It should be understood, however, that example embodiments of the present invention described herein can be modified in form and detail without departing from the spirit and scope of the present invention. Accordingly, the embodiments described herein are provided by way of example and not of limitation, and the scope of the present invention is not restricted to the particular embodiments described herein.

In particular, the relative thicknesses and positioning of structures or regions may be reduced or exaggerated for clarity. In other words, the figures are not drawn to scale. Further, a structure is considered as being formed "on" another structure when formed either directly on the referenced structure or formed on other structures overlaying the referenced structure.

Reference number similarities from one figure to the next may suggest at least similar components/items.

In developing embodiments of the present invention, the following observation regarding the Background Art arrangement of wires on the PCB of a DIMM was made, and a path to an alternate arrangement of wires on a PCB of an inline memory module (IMM) was identified. Clustering the vias along a central axis (see, e.g., Background Art FIGS. 1B & 1C) tends to produce combined front and rear wire lengths ($L_A+L_B$) that are longer than is desirable (due, e.g. to being proportional to device withdth), which can induce unnecessary signal propagation delays. At least one embodiment of the present invention reduces (if not substantially minimizes) wire lengths.

FIG. 3 is a block diagram of an in-line memory module (IMM) 300, e.g., a dual IMM (DIMM) of any of the various varieties thereof, according to an embodiment of the present invention. More particularly, the IMM 300 can be, e.g., a registered DIMM (RDIMM) such as might be used in a server, an unregistered DIMM (UDIMM) such as might be used in a PC, a small outline DIMM (SO DIMM), a micro DIMM, a double data rate DIMM (DDR DIMM), etc.

In FIG. 3, the IMM 300 includes a plurality of integrated circuit memory devices, 301, 302, . . . , 317 and 318, where each memory device can be the same. For example, integrated circuit memory devices 301, 302, . . . , 317 and 318 can be packaged devices each of which contains one or more integrated circuit chips, where the packaging may take the form, e.g., of plastic loaded packages, BGAs (ball grid arrays), WFPs (wafer-level fabricated packages), etc.

Stubs 320_k (320_01_k, . . . , 320_18_k) can connect memory devices 301-318 to transmission lines 322 and 324, respectively. Stubs 326 and 328 can connect transmission lines 322 & 324 to a bus 330. In other words, memory devices 301-310 (for each $k^{th}$ input/output (I/O) terminal), can be coupled to bus 330 via stub 326, transmission line 322 and stubs 320_01_k-320_10_k. Memory devices 311-318 (for each $k^{th}$ I/O terminal) can be coupled to bus 330 via stub 328, transmission line 324 and stubs 320_11_k-320_18_k. Different groupings of memory devices can be included in such an IMM. Other numbers of memory devices can be included in such an IMM. Other arrangements of stubs, transmission lines and/or buses can be used to implement such an IMM.

Each common input/output (I/O) terminal of memory devices 301-318 typically is functionally the same. Each common input/output (I/O) terminal of memory devices 301-318 can be connected together, respectively. Of the plurality of I/O terminals that each of memory devices 301-318 comprises, only one such I/O terminal is depicted in FIG. 3. In other words, the wires depicted in FIG. 3, namely stubs 320_k, transmission lines 322 & 324, stubs 326 & 328 and bus 330 represent a simplification by which the signal path for only one of the given common terminals of memory devices 301-318 is depicted.

Memory devices, e.g., 303 & 304 align at a first reference location (relative to a reference axis, e.g., the longitudinal axis of a PCB that is not shown in FIG. 3 but which is included in IMM 300), so as to at least significantly overlap each other. Similarly, e.g., memory devices 307 & 308 align at a second reference location so as to significantly overlap each other. To simplify description, memory devices 303 & 304 will be referred to as a positional-twin pair 332_03&04, memory devices 307 and 308 will be referred to as a positional-twin pair 332_07&08, etc.

Figure 1B:
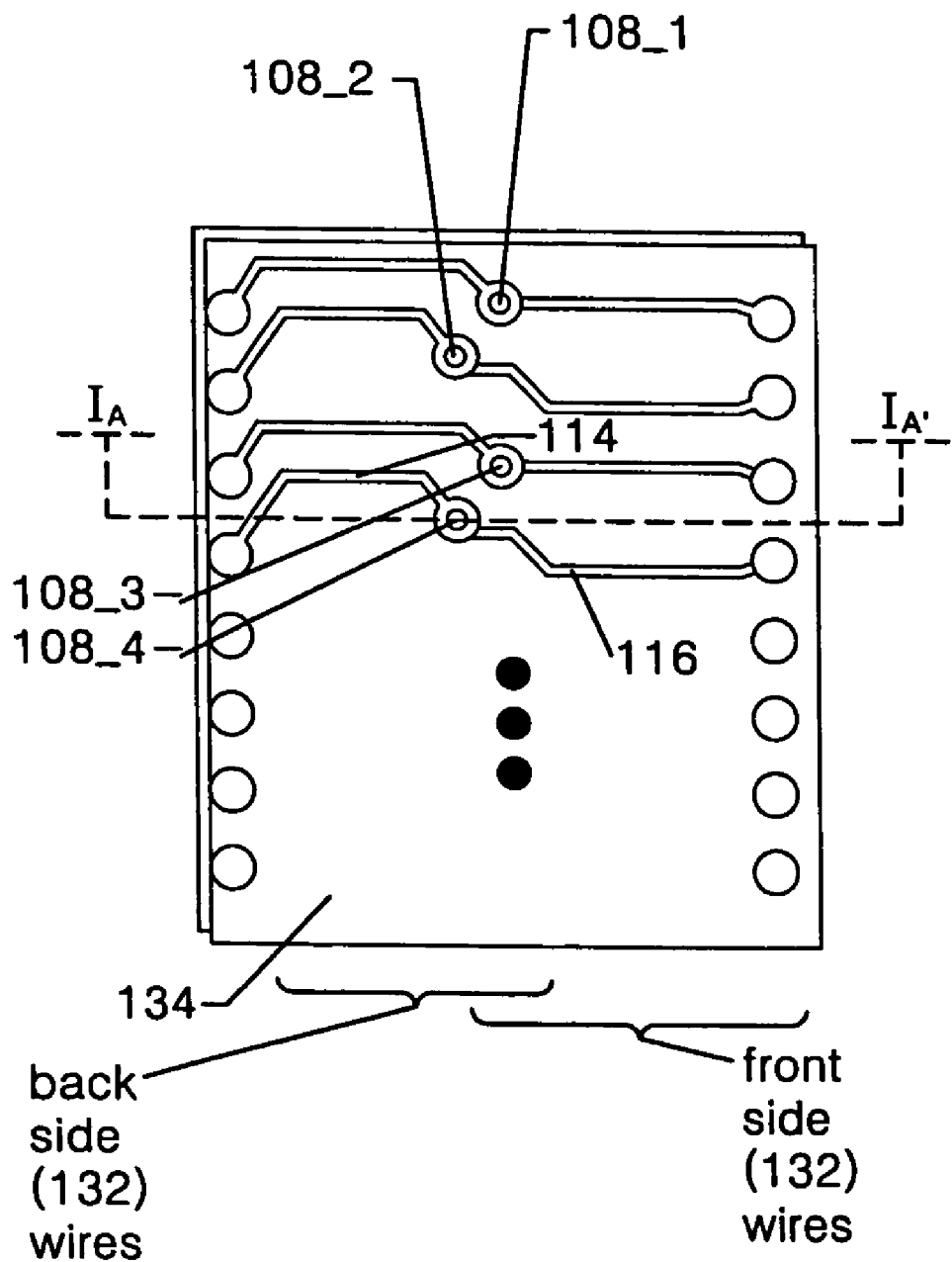
FIG. 1B is a front view of the printed wires and vias of the PCB of FIG. 1A that fall within the overlying footprints of first positional-twin memory devices thereon, according to the Background Art.
Figure 4A:
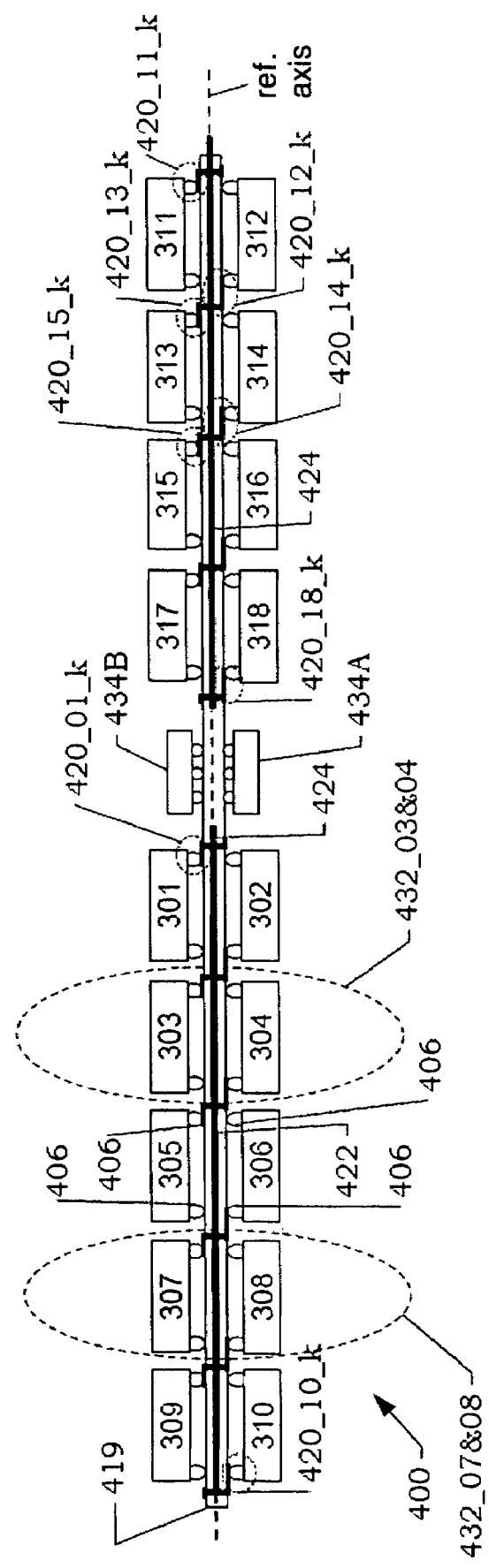
FIG. 4A is a cross-section of an IMM, e.g., a DIMM of any of the various varieties thereof, according to an embodiment of the present invention, where the section line (not depicted) is similar to the section line depicted in FIGS. 1A & 1B.

FIG. 4A is a cross-section of an IMM 400, e.g., a DIMM of any of the various varieties thereof, according to an embodiment of the present invention, where the section line (not depicted) is similar to the section line depicted in FIGS. 1A & 1B. The IMM 400 can be an example of IMM 300.

In FIG. 4A, IMM 400 includes: a printed circuit board (PCB) 419; and integrated circuit memory devices 301-318. Even numbered memory devices 302-318 represent a first array of memory devices on a first side of PCB 419. Odd numbered memory devices 301-311 represent a second array of memory devices on a second side of PCB 419. Conductive terminals 406, e.g. conductive balls, as I/O terminals of the memory devices can connect conductive I/O terminals of the circuits (not shown) in memory devices 301-318 to the various wires on PCB 419, respectively. The IMM 400 further can include integrated circuit devices 434A and 434B. Each of devices 434A & 434B can be a buffer or a register device.

Figure 1C:
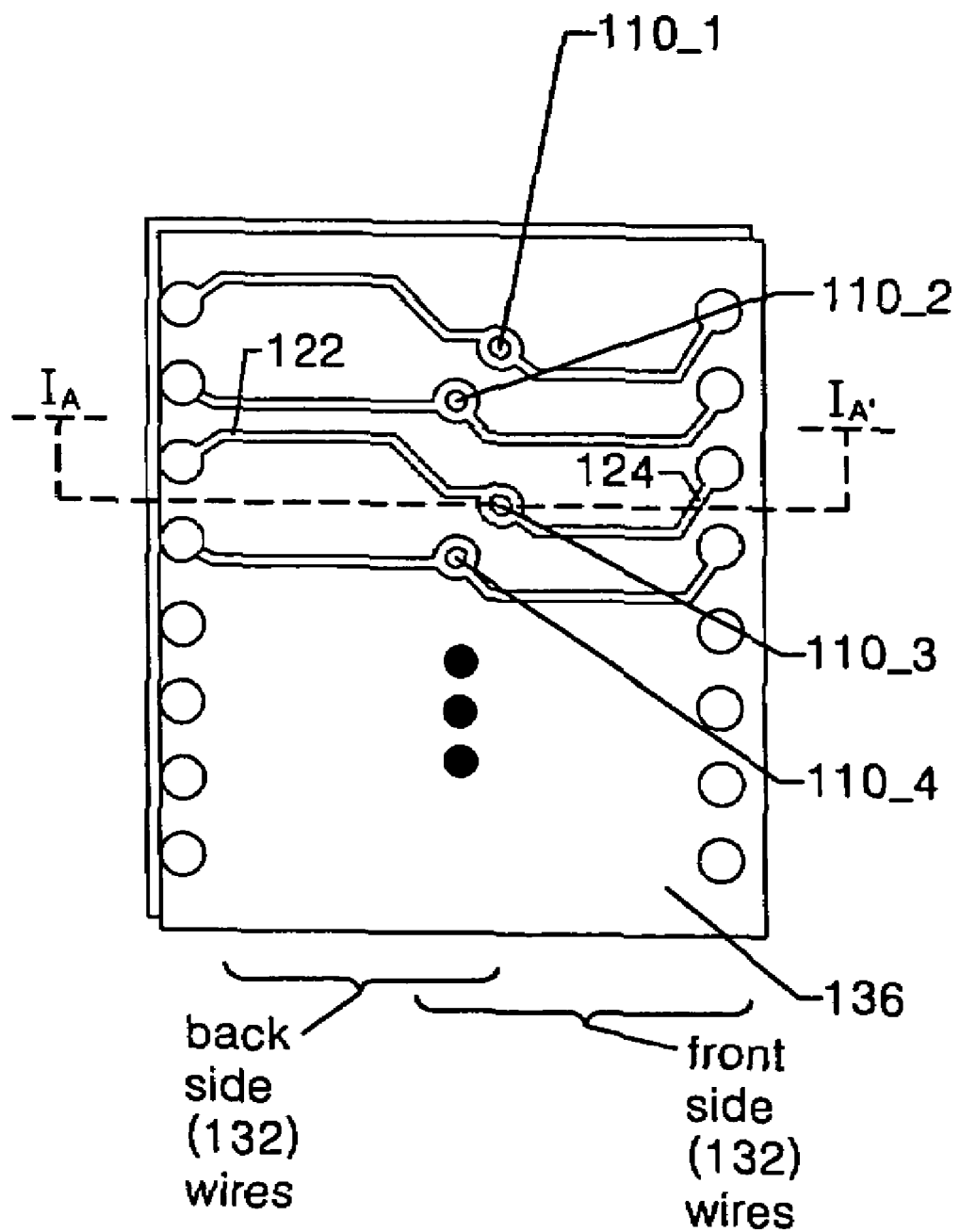
FIG. 1C is a front view of the printed wires and vias of the PCB of FIG. 1A that fall within the overlying footprints of second positional-twin memory devices thereon, according to the Background Art.
Figure 2C:
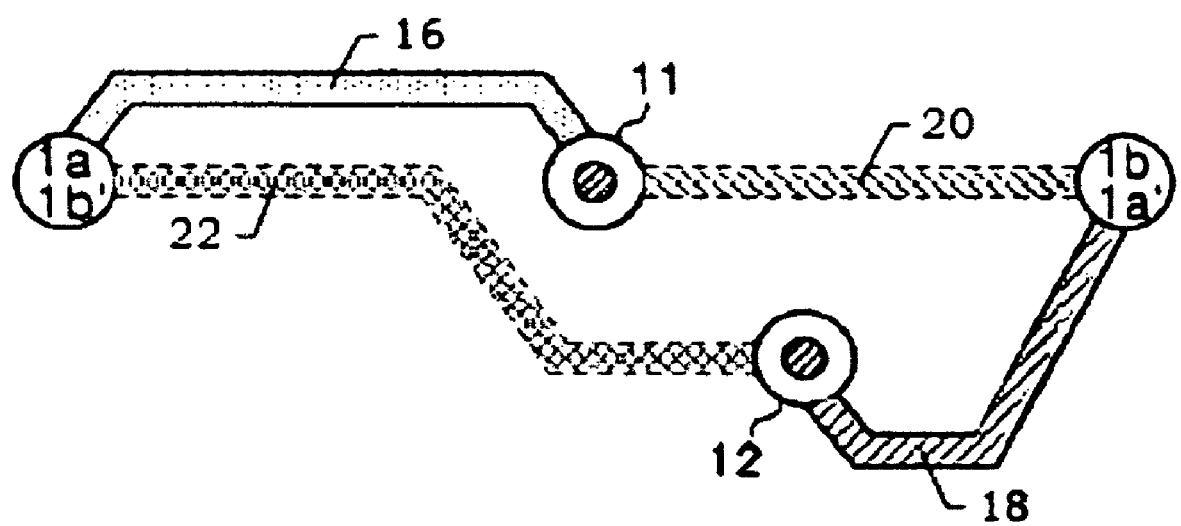
FIG. 2C is a front view of the printed wires and vias of the PCB of FIGS. 2A & 2B that fall within the overlapped footprints of the positional-twin memory devices, according to the Background Art.

Relative to a reference axis, e.g., the longitudinal axis of PCB 419, memory devices in the first array can be described as substantially completely overlapping memory devices in the second array. More specifically, e.g., memory devices 303 & 304 of IMM 400 align at a first reference location so as to substantially completely overlap each other. Similarly, e.g., memory devices 307 & 308 of IMM 400 align at a second reference location so as to substantially completely overlap each other. Among the plurality of positional-twin pairs depicted in FIG. 4A, to simplify illustration only two are called out, namely positional-twin pairs 432_03&04 432_07&08. At least some of terminals 406 for memory devices 301-318 can be described as being clustered along opposing edges of each such memory device, in a manner similar to what is depicted in FIGS. 1B & 1C.

Also in FIG. 4A (similar to FIG. 3), the cross-section is taken so that the signal path for only one set of common input/output (I/O) terminals of memory devices 301-318 are represented. Hence, the wires depicted in FIG. 4A, namely stubs 420_i_k and transmission lines 422 & 424, represent a simplification by which the signal path for only one (hereafter, the $k^{th}$ one) of the common terminals of memory devices 301-318 is depicted.

Even numbered stubs are depicted in FIG. 4A although only stubs 420_12_k and 420_14_k are called out, for simplicity of illustration. Similarly, odd numbered stubs also are depicted in FIG. 4A although only stubs 420_13_k and 420_15_k are called out, for simplicity of illustration.

Figure 4B:
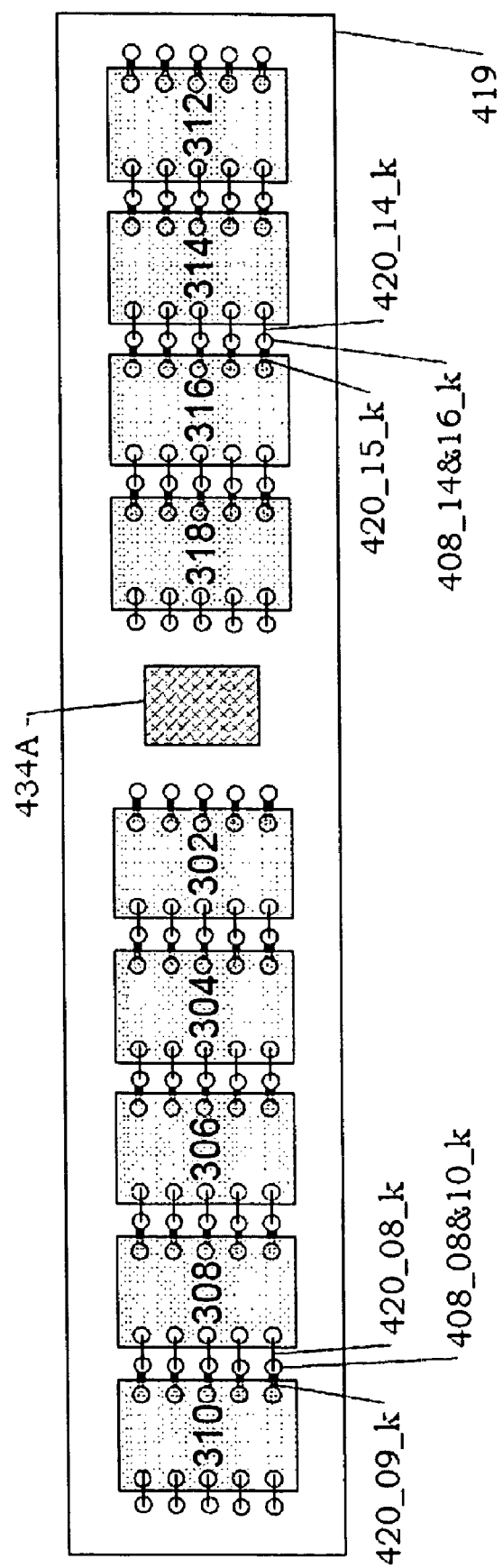
FIG. 4B is a front view of the IMM of FIG. 4A.

FIG. 4B is a front view of IMM 400.

In FIG. 4B, even numbered stubs are depicted although only stubs 420_08_k and 420_14_k are called out, for simplicity of illustration. As FIG. 4B is a front view, the numbering convention for the vias reflects the footprints of the memory devices between which the via is located. For example, via 408_08&10_k should be understood as indicating that this via is located in a region between terminals 406 for memory devices 308 & 310 on the front side of PCB 419 depicted in FIG. 4B. The even numbered stubs (420_08_k, 420_14_k, etc.) can connect vias 408_m&(m+2)_k to the even numbered memory devices(302, 304, 306 ... ), where m represents the number of a first even numbered memory device on a front side 430 (see FIG. 4C) of PCB 419, m+2 represents the number of the memory device adjacent (relative to the reference axis) to the first numbered memory device, and k reflects that FIG. 4B depicts the signal path for the $k^{th}$ one of the common terminals of the memory devices. For example, stubs 420_08_k and 420_16_k can connect vias 408_08&10_k and 408_14&16_k to memory devices 308 and 314, respectively.

Odd numbered stubs also are depicted in FIG. 4B although only stubs 420_09_k and 420_15_k are called out, for simplicity of illustration. It is to be understood that the odd numbered stubs are located on the other side of PCB 419 relative to the even numbered stubs, but PCB 419 has been depicted as partially transparent in order to make the odd numbered studs visible in FIG. 4B and thus better convey the relationship between the odd numbered stubs & the even numbered stubs and the vias. The odd numbered stubs (420_09_k, 420_15_k, etc.) can connect vias 408_m&(m+2)_k to the odd numbered memory devices (not shown in FIG. 4B) on the other side of PCB 419, where m can represent a given memory device on front side 430 of PCB 419, m−1 can represent the number of the positional-twin memory device (namely, an odd numbered memory device) on rear side 432 (see FIG. 4C) of PCB 419 relative to memory device m, and m−3 can represent the number of a memory device on rear side 432 adjacent (relative to the reference axis) to the positional-twin memory device. For example, stubs 420_09_k and 420_15_k can connect vias 408_8&10_k and 408_16&14_k to memory devices 309 (not shown in FIG. 4B) and 315 (not shown in FIG. 4B).

Figure 4C:
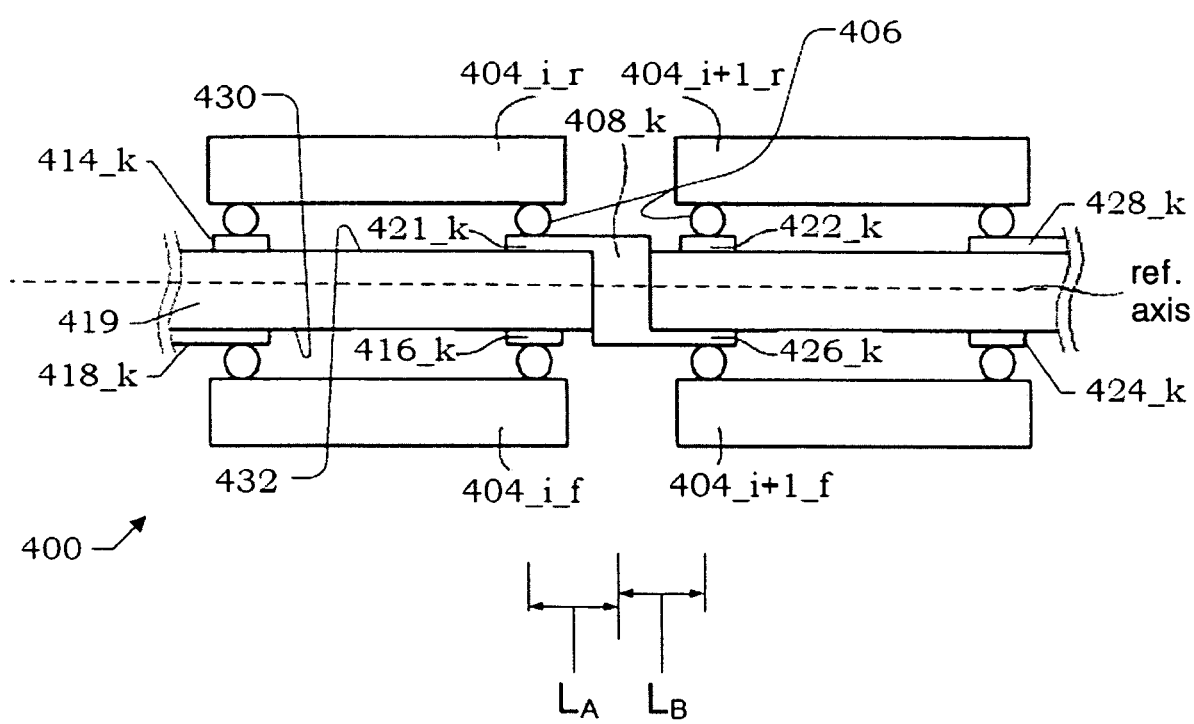
FIG. 4C is an exploded view of adjacent $i^{th}$ and $(i+1)^{th}$ memory devices in the IMM of FIG. 4A, according to an embodiment of the present invention.

FIG. 4C is an exploded view of adjacent $i^{th}$ and $(i+1)^{th}$ devices in IMM 400, according to an embodiment of the present invention.

Inspection of FIG. 4C reveals that PCB 419 has a front side 430 and a back side 432. Memory devices 404_i_f and 404_i+1_f can be mounted on front side 430 of PCB 419. Memory devices 404_i_r and 404_i+1_r can be mounted on the back side 432 of PCB 419. Conductive segments (again, referred hereto as wires) are printed on front side 430 and the back side 432 of PCB 419. More particularly, wires 416_k, 418_k, 424_k and 426_k are visible in FIG. 4C on front side 430 of PCB 419, and wires 414_k, 421_k, 422_k and 428_k are visible in FIG. 4C on the back side 432 of PCB 419. The vias are formed in PCB 419, of which via 408_k is visible in FIG. 4C.

The via 408_k can be part of a signal path that connects wire 420_k for memory device 404_i_r to wire 426_k for memory device 404_i+1_f. It is to be observed that memory device 404_i+1_r is adjacent (in terms of the reference axis)

to memory device 404__i__r, where memory device 404__i+1__r can be described as the positional-twin of memory device 404__i+1__f. As such, via 408__k can be described as being located in a region defined between terminals 406 (or the underlying portions of the wires connected thereto) of adjacent (in terms of the reference axis) memory devices 404__i__r and 404__i+1__r. That region, in terms of FIG. 4C, also happens to be defined between terminals 406 (or the overlying portions of the wires connected thereto) of adjacent (in terms of the reference axis) memory devices 404__i__f and 404__i+1__f.

In FIG. 4C, the combined length $L_A + L_B$ of electrically connected wires, e.g., 420__k and 426__k, is significantly (if not substantially) shorter than corresponding wires in the central axis-clustered arrangement Background Art FIG. 1A. This is because, e.g., via 408__k is not located under a central axis of either memory devices 404__i__r or 404__i+1__f. Rather, via 408__k is located between memory devices 404i__r and 404__i+1__f so as to be closer to the pertinent conductive terminals of both of memory devices 404__i__r and 404__i+1__f, not merely one (which may be a generous description) or the other.

Figures 5A, 5B:
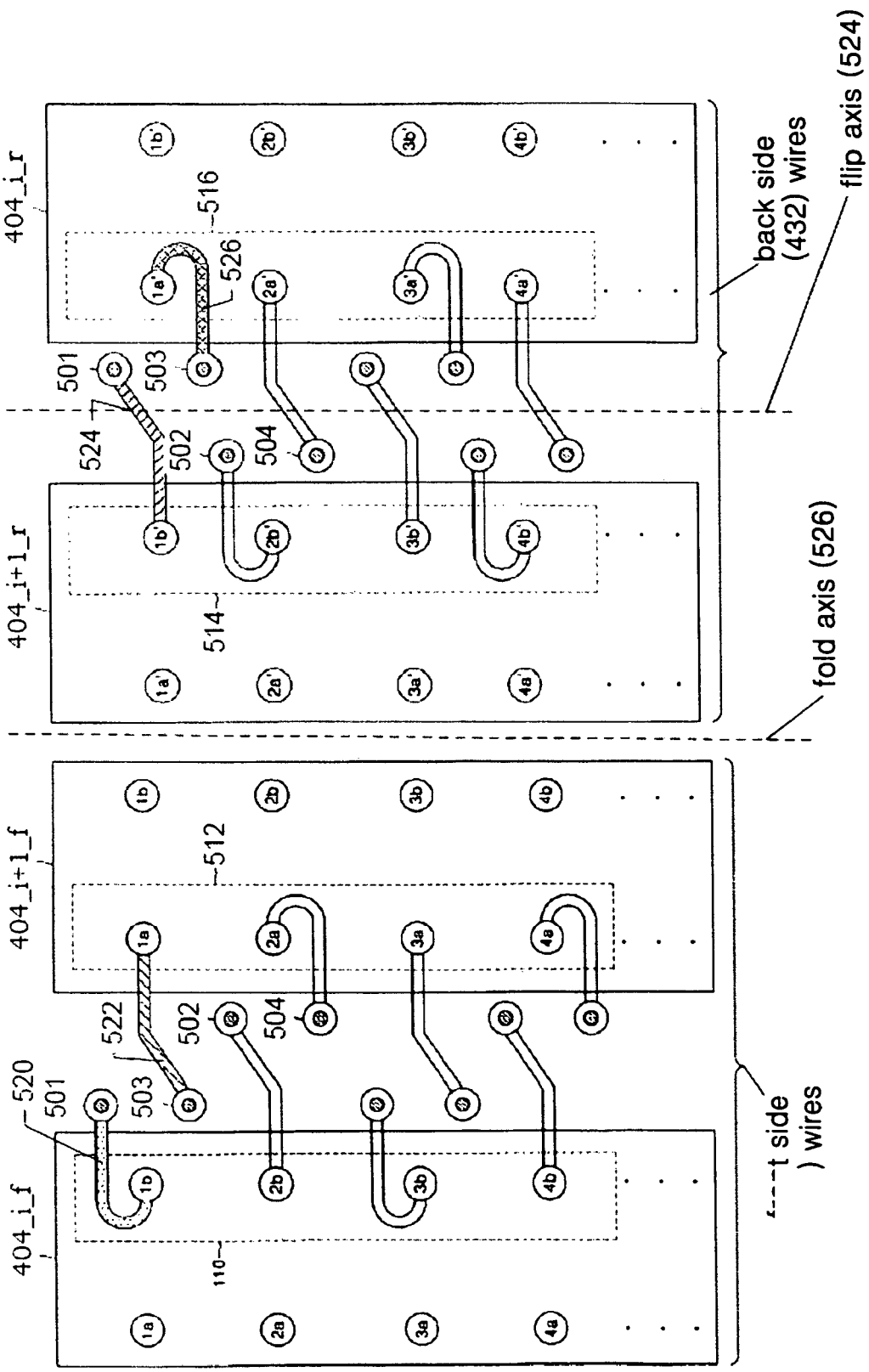
FIG. 5A is a front view of the printed wires and vias on a front side of a PCB (albeit not depicted in FIG. 5A) in an IMM (albeit not depicted in FIG. 5A) with respect to the overlying footprints of memory devices i_f and i+1_f, according to an embodiment of the present invention.
FIG. 5B is a front view of the printed wires and vias on the back side of the PCB (albeit not depicted in FIG. 5A) in IMM 400 (albeit not depicted in FIG. 5A) with respect to the overlying footprints of memory devices i_r and i+1_r, according to an embodiment of the present invention.
Figure 5C:
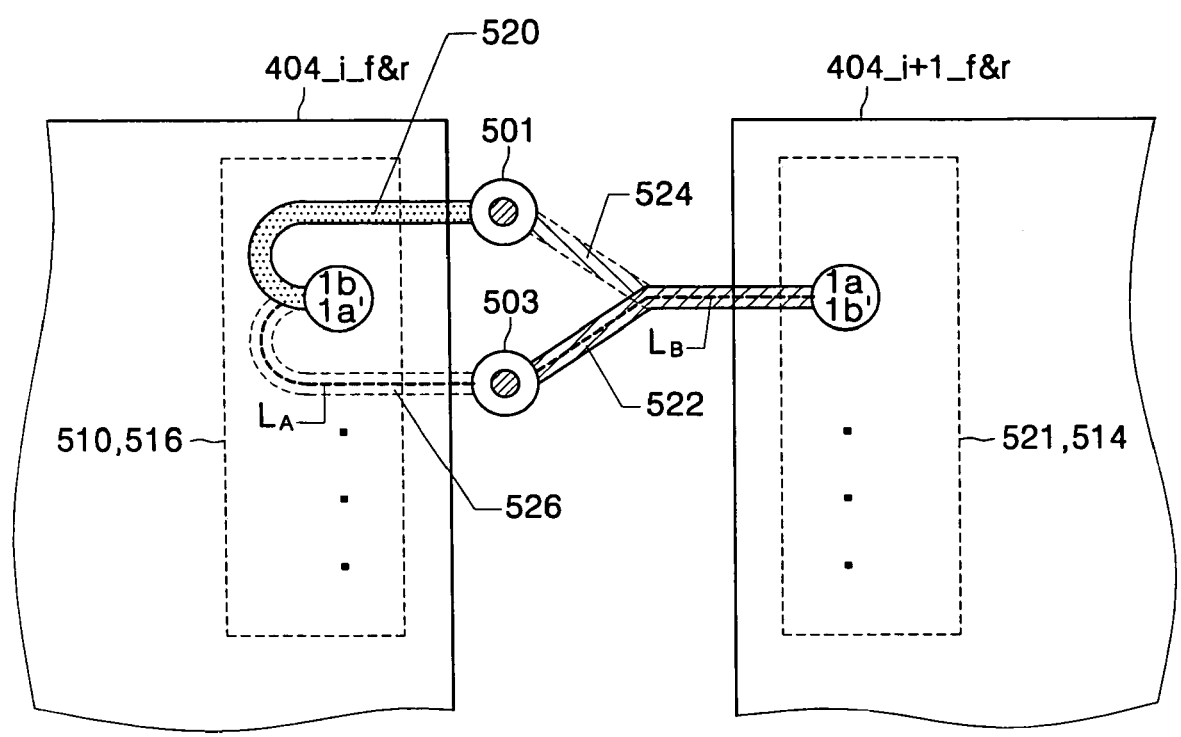
FIG. 5C is a view of a portion of FIG. 5A superimposed on a portion of a flipped version of FIG. 5B.

A fuller understanding of FIGS. 4A & 4C can be facilitated with reference to FIGS. 5A-5C.

FIG. 5A is a front view of the printed wires and vias on the front side 430 of PCB 419 (albeit not depicted in FIG. 5A) in IMM 400 (albeit not depicted in FIG. 5A) with respect to the overlying footprints of memory devices 404__i__f and 404__i+1__f, according to an embodiment of the present invention. FIG. 5B is a front view of the printed wires and vias on back side 432 of PCB 419 (albeit not depicted in FIG. 5A) in IMM 400 (albeit not depicted in FIG. 5A) with respect to the overlying footprints of memory devices 404__i__r and 404__i+1__r, according to an embodiment of the present invention. FIG. 5C is a view of a portion of FIG. 5A superimposed on a portion of a flipped version of FIG. 5B, in which the printed wires and vias of PCB 419 (albeit not depicted in FIG. 5A) in the IMM 400 (albeit not depicted in FIG. 5A) that fall within the overlapped footprints of positional-twin pairs 332__i__f&r (comprised of memory devices 404__i__f & 404__i__r) and 332__i+1__f&r (comprised of memory devices 404__i+1__f & 404__i+1__r) are depicted. FIGS. 5A-5C (again) are provided to enhance understanding of FIGS. 4A-4C.

A description of how FIG. 5C is obtained can be as follows: rotate FIG. 5B 180° about a flip axis 524; and then superimpose FIG. 5A upon the rotated version of FIG. 5B. Alternatively, a description of how FIG. 5C is obtained can be as follows: make a left-hand rotation of FIG. 5A about a fold axis 524 and make a right-hand rotation of FIG. 5B about fold axis 524, bringing FIG. 5A toward FIG. 5B as one might close a book or fold a sheet of paper; and then make a left-hand rotation of the closed-book/folded-sheet until the wires in the closed-book/folded-sheet corresponding to the wires in FIG. 5A have the same orientation as in FIG. 5A.

In FIG. 5C, vias 501 and 503 can connect wires 520 & 524 and 522 & 526, respectively. Pads 1a and 1b' (or, in other words, end portions) of wires 522 and 524, respectively, are not electrically connected, but they do overlap (again, given the relationship of FIG. 5C to FIGS. 5A-5B). Hence, in FIG. 5C, one circle encloses both reference numbers 1a and 1b'. Similarly, pads 1a' and 1b of wires 526 and 520, respectively, are not electrically connected, but they do overlap. Accordingly, in FIG. 5C, one circle encloses both reference numbers 1a' and 1b.

It is to be noted that all of the statements made above apply to most of memory devices 301-318. But there can be exceptions for the outer devices 309 & 310 and 311 & 312, and for the inner devices 301 & 302 and 317 & 318. Stubs 420_12__k & 420_13__k can be considered as paired stubs. Similarly, stubs 420_14__k & 420_15__k, as well as others not explicitly called out, namely 420_16__k & 420_17__k, 420_02__k & 420_03__k, 420_04__k & 420_05__k, 420_06__k & 420_07__k and 420_08__k & 420_09__k, can be considered as paired stubs. But stubs 420_11__k, 420_18__k, 420_01__k and 420_10__k can be considered as unpaired stubs.

Figure 4D:
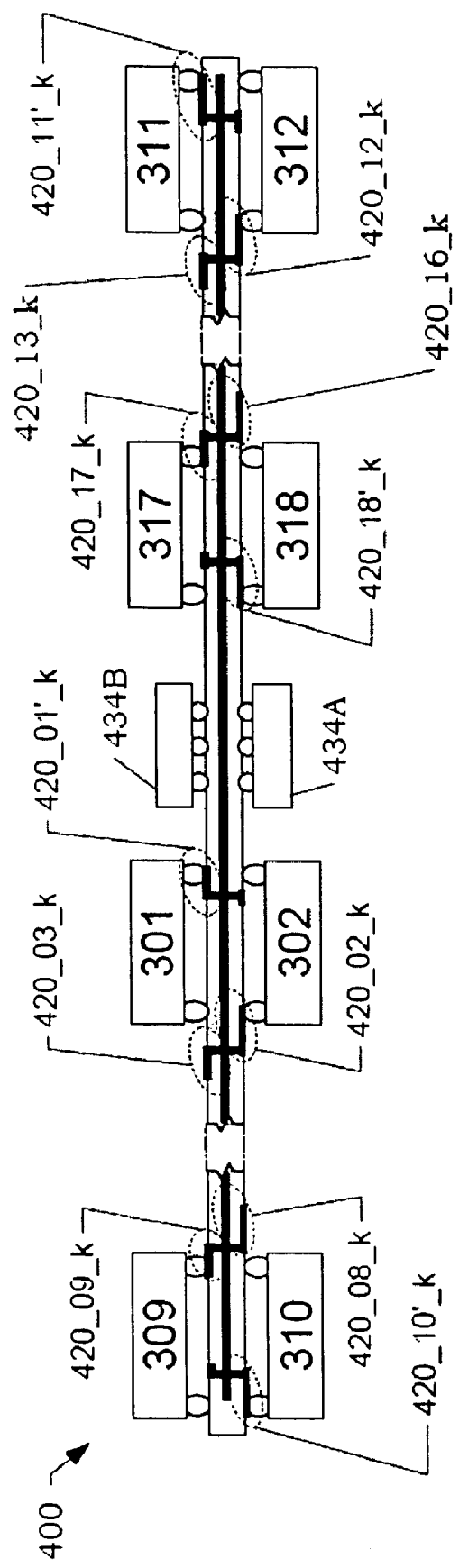
FIG. 4D is a cross-section of an IMM, according to an embodiment of the present invention, that represents an alternative arrangement to the IMM of FIG. 4A.

FIG. 4D is a cross-section of an IMM 400', according to an embodiment of the present invention, that represents an alternative arrangement to the IMM 400 of FIG. 4A.

In IMM 400', locations of the vias assigned to unpaired stubs 420_11'__k, 420_18'__k, 420_01'__k and 420_10'__k have been moved relative to their counterpart unpaired stubs 420_11__k, 420_18__k, 420_01__k and 420_10__k in FIG. 4A, respectively. More particularly, the vias have been moved inward from peripheral signal pads of the respective memory devices 311, 318, 301 and 310, respectively. Such inward locations can, e.g., reduce a length of the unpaired stubs, respectively.

Other locations of vias for the paired stubs are contemplated. For example, consider FIG. 6A.

Figure 6A:
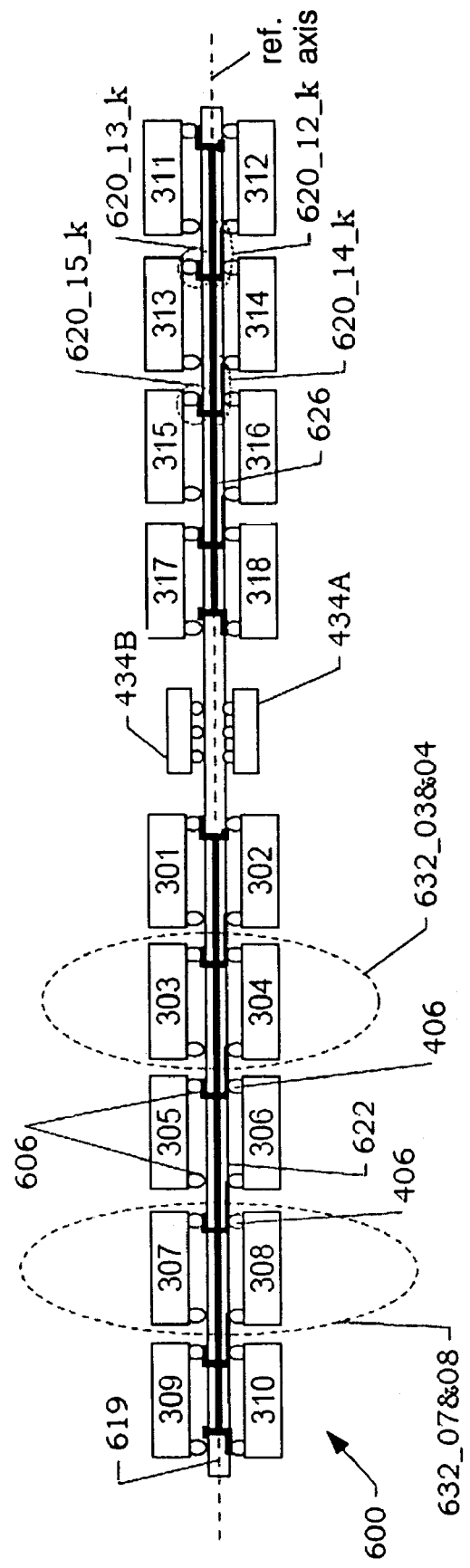
FIG. 6A is a cross-section of an IMM, according to an embodiment of the present invention, where the section line (not depicted) is similar to the section line depicted in FIGS. 1A & 1B.

FIG. 6A is a cross-section of an IMM 600, e.g., a DIMM of any of the various varieties thereof, according to an embodiment of the present invention, where the section line (not depicted) is similar to the section line depicted in FIGS. 1A & 1B. The IMM 600 can be another example of IMM 300.

In FIG. 6A, the IMM 600 includes: a printed circuit board (PCB) 619; and integrated circuit memory devices 301-318. Even numbered memory devices 302-318 represent a first array of memory devices on a first side of PCB 619. Odd numbered memory devices 301-311 represent a second array of memory devices on a second side of PCB 619. Conductive terminals 406, e.g., conductive balls, as I/O terminals of the memory devices can connect conductive I/O terminals of the circuits (not shown) in memory devices 301-318 to the various wires on PCB 619, respectively. The IMM 600 further can include buffer or register devices 434A and 434B.

Relative to a reference axis, e.g., the longitudinal axis of PCB 619, memory devices in the first array can be described as substantially completely overlapping memory devices in the second array. More specifically, e.g., memory devices 303 & 304 of the IMM 400 align at a first reference location so as to substantially completely overlap each other. Similarly, e.g., memory devices 307 & 308 of the IMM 400 align at a second reference location so as to substantially completely overlap each other. Among the plurality of positional-twin pairs depicted in FIG. 6A, to simplify illustration only two are called out, namely positional-twin pairs 632_03&04 632_07&08. At least some of terminals 406 of memory devices 301-318 can be described as being clustered along opposing edges of each such memory device, in a manner similar to what is depicted in FIGS. 1B & 1C.

Also in FIG. 6A (similar to FIG. 3), the cross-section is taken so that signal path for only one set of common input/output (I/O) terminals of memory devices 301-318 are represented. Hence, the wires depicted in FIG. 6A, namely stubs 620__i__k and transmission lines 622 & 626, represent a simplification by which signal path for only one (hereafter, the $k^{th}$ one) of the common terminals of memory devices 301-318 is depicted.

Even numbered stubs are depicted in FIG. 6A although only stubs 620_12__k and 620_14__k are called out, for simplicity of illustration. Similarly, odd numbered stubs also are depicted in FIG. 6A although only stubs 620_13__k and 620_15__k are called out, for simplicity of illustration.

Figure 6B:
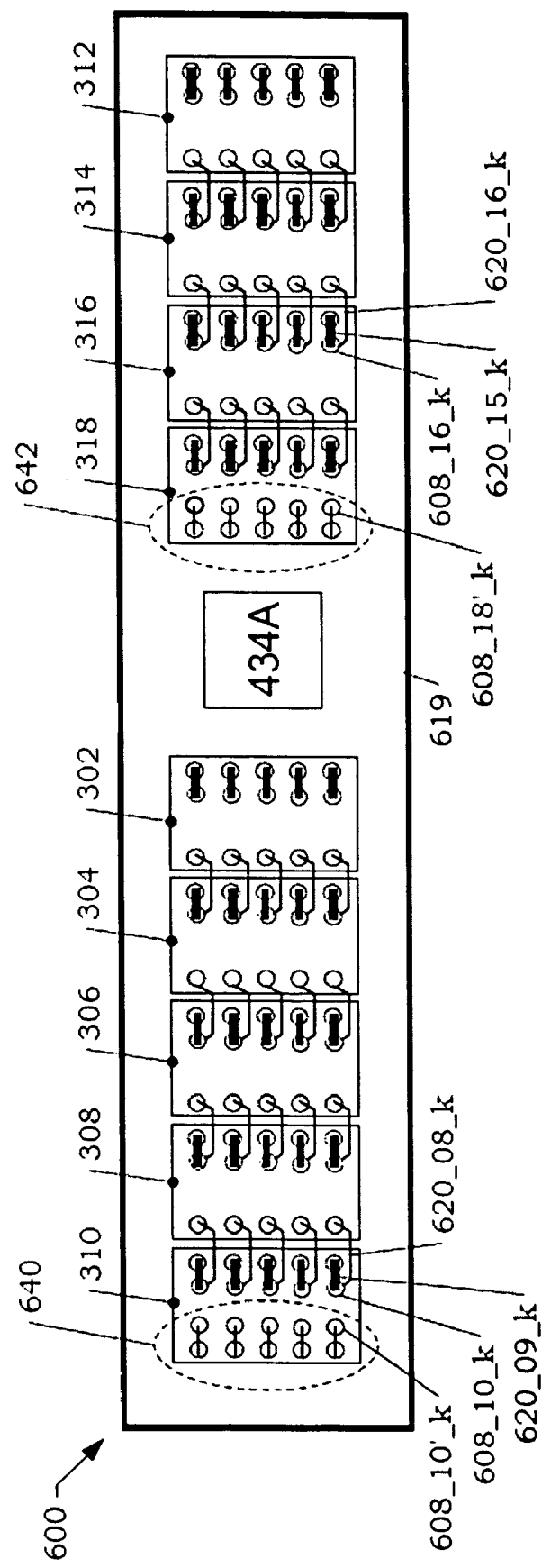
FIG. 6B is a front view of the IMM of FIG. 6A.

FIG. 6B is a front view of IMM 600.

In FIG. 6B, even numbered stubs are depicted although only stubs 620_08_k and 620_16_k are called out, for simplicity of illustration. As FIG. 6B is a front view, the numbering convention for the vias reflects the footprint of the memory device in which the via is located. For example, via 608_10_k should be understood as indicating that this via is located within the footprint of memory device 310. The even numbered stubs can connect vias 608_m_k to the even numbered memory devices, where m represents the number of the memory device on the first side of a PCB 619 depicted in FIG. 6B. For example, stubs 620_08_k and 620_16_k can connect vias 608_10_k and 608_16_k to memory devices 308 and 314, respectively.

Odd numbered stubs also are depicted in FIG. 6B although only stubs 620_09_k and 620_15_k are called out, for simplicity of illustration. It is to be understood that the odd numbered stubs are located on the other side of PCB 619 relative to the even numbered stubs, but PCB 619 has been depicted as partially transparent in order to make the odd numbered studs visible in FIG. 6B and thus better convey the relationship between the odd numbered stubs & the even numbered stubs and the vias. The odd numbered stubs can connect vias 608_m_k to the odd numbered memory devices (not shown in FIG. 6B) on the other side of PCB 619, where m represents the number of the positional-twin memory device relative thereto on the first side 630 of PCB 619. For example, stubs 620_09_k and 620_15_k can connect vias 608_10_k and 608_16_k to memory devices 309 (not shown in FIG. 6B) and 315 (not shown in FIG. 6B).

Figure 6C:
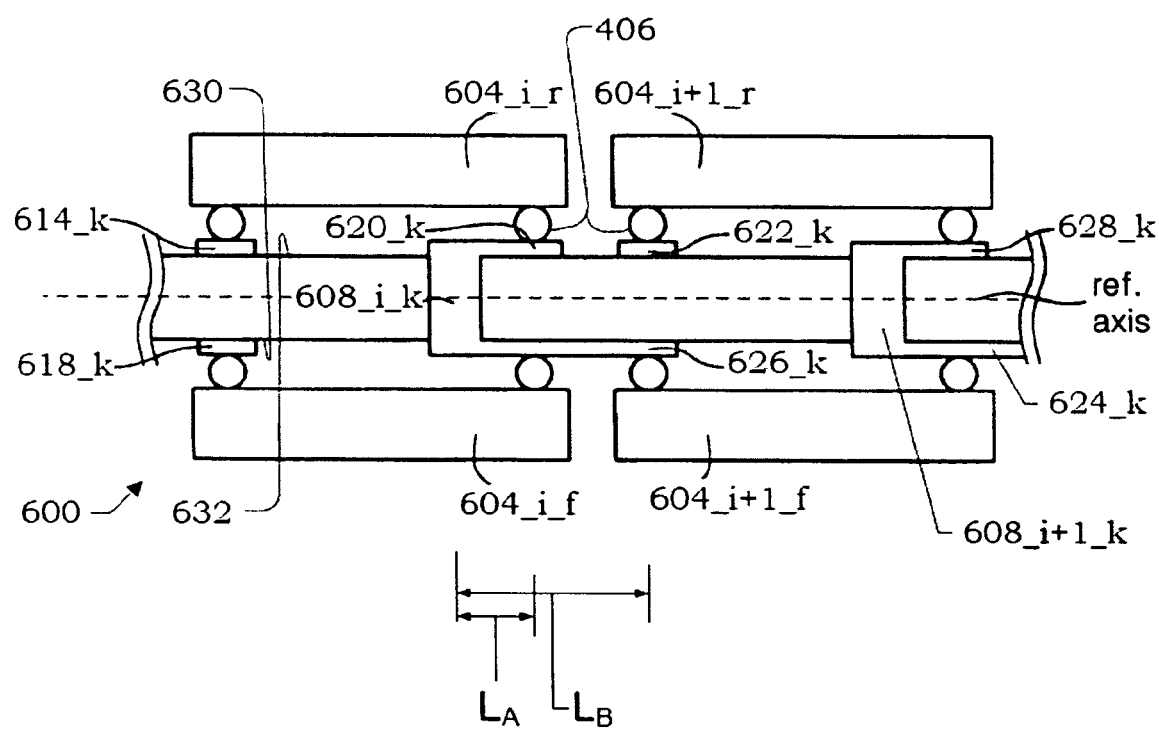
FIG. 6C is an exploded view of adjacent $i^{th}$ and $(i+1)^{th}$ devices in the IMM of FIG. 6A, according to an embodiment of the present invention.

FIG. 6C is an exploded view of adjacent i$^{th}$ and (i+1)$^{th}$ devices in IMM 600, according to an embodiment of the present invention.

Inspection of FIG. 6C reveals that PCB 619 has a front side 630 and a back side 632. Memory devices 604_i_f and 604_i+1_f can be mounted on front side 630 of PCB 619. Memory devices 604_i_r and 604_i+1_r can be mounted on back side 632 of PCB 619. Conductive segments (again, referred hereto as wires) are printed on the front side 630 and the back side 632 of PCB 619. More particularly, wires 618_k, 624_k and 626_k are visible in FIG. 6C on front side 630 of PCB 619, and wires 614_k, 620_k, 622_k and 628_k are visible in FIG. 6C on back side 632 of PCB 619. The vias are formed through PCB 619, of which via 608_i_k and 608_i+1_k are visible in FIG. 6C.

The via 608_k can be part of a signal path that connects wire 620_k of memory device 604_i_r to wire 626_k for memory device 604_i+1_f. It is to be observed that memory device 604_i_f is adjacent (in terms of the reference axis) to memory device 604_i+1_f, where memory device 604_i_f can be described as the positional-twin of memory device 604_i_r. As such, via 608_i_k can be described as being located inward from peripheral terminals 406 (or the underlying portions of the wires connected thereto) of each of the positional-twin memory devices 604_i_r and 604_i_f.

In FIG. 6C, the combined length $L_A + L_B$ of electrically connected wires, e.g., 620_k and 626_k is significantly (if not substantially) shorter than corresponding wires in the central axis-clustered arrangement Background Art FIG. 1A. This is primarily because of the arrangement of wire 626_k.

Figure 7A:
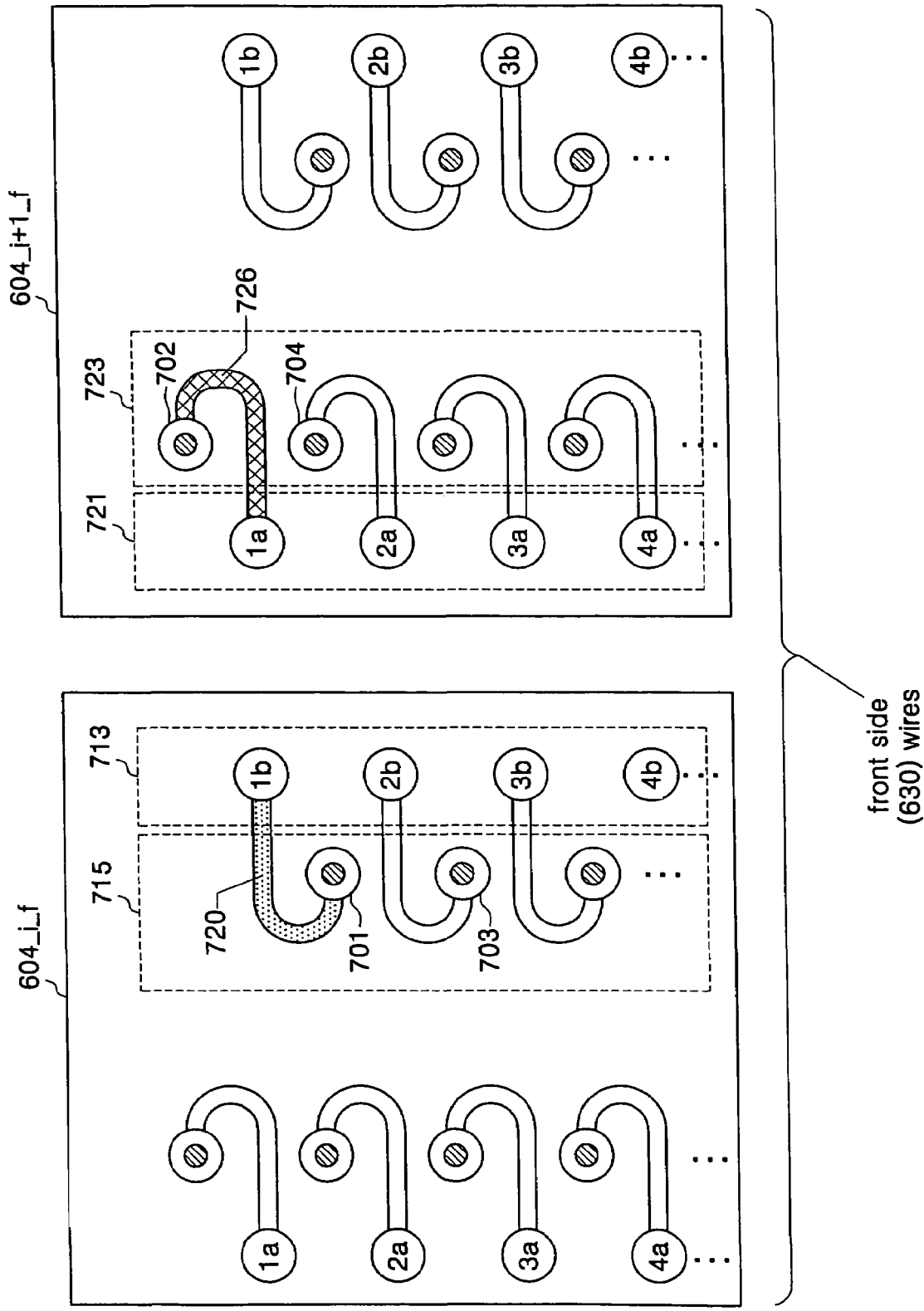
FIG. 7A is a front view of the printed wires and vias on a front side 630 of PCB 619 (albeit not depicted in FIG. 7A) in IMM 600 (albeit not depicted in FIG. 7A) with respect to the overlying footprints of memory devices 604_i_f and 604_i+1_f, according to an embodiment of the present invention.
Figure 7B:
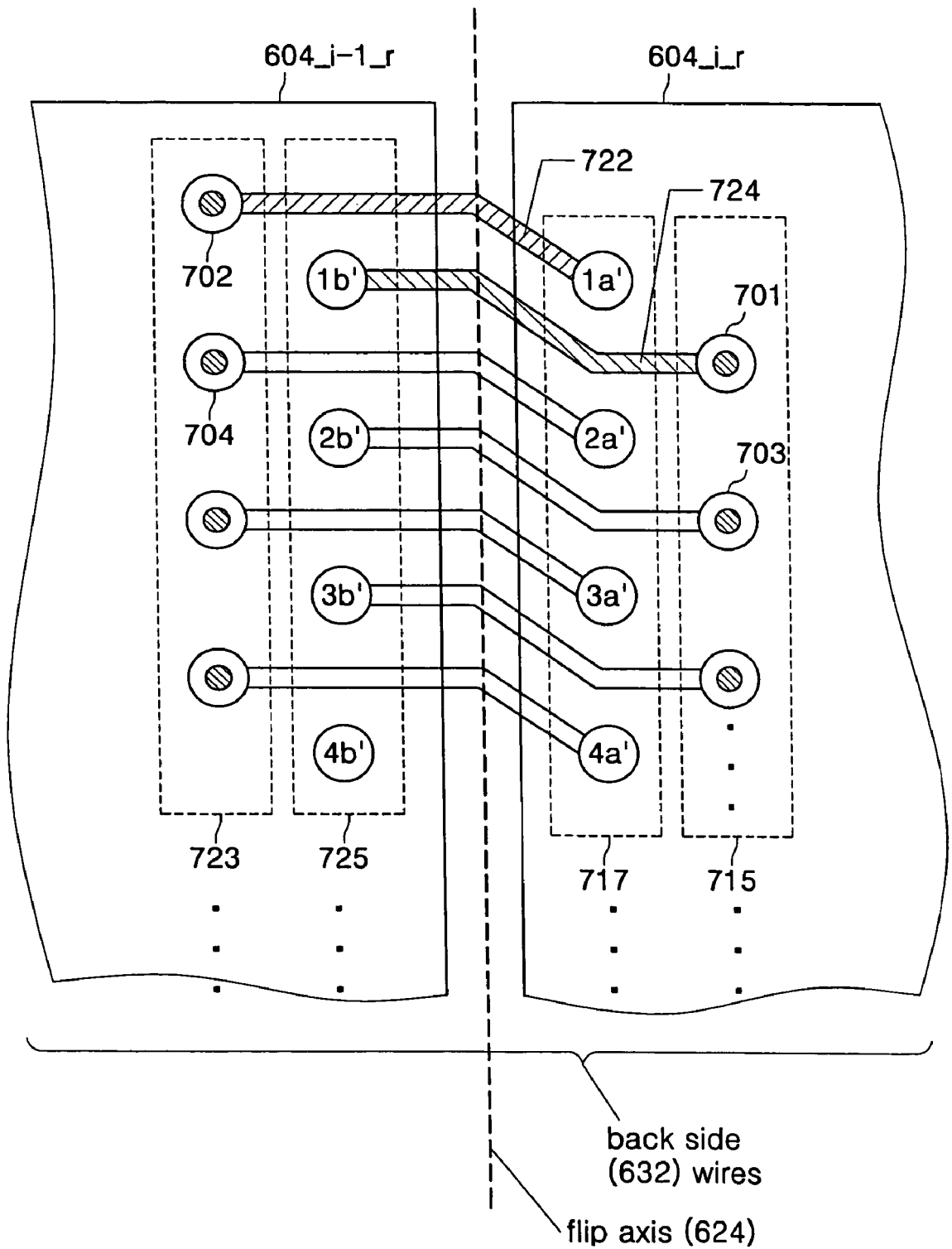
FIG. 7B is a front view of the printed wires and vias on back side 632 of PCB 619 (albeit not depicted in FIG. 7A) in IMM 600 (albeit not depicted in FIG. 7A) with respect to the overlying footprints of memory devices 604_i_r and 604_i+1_r, according to an embodiment of the present invention.
Figure 7C:
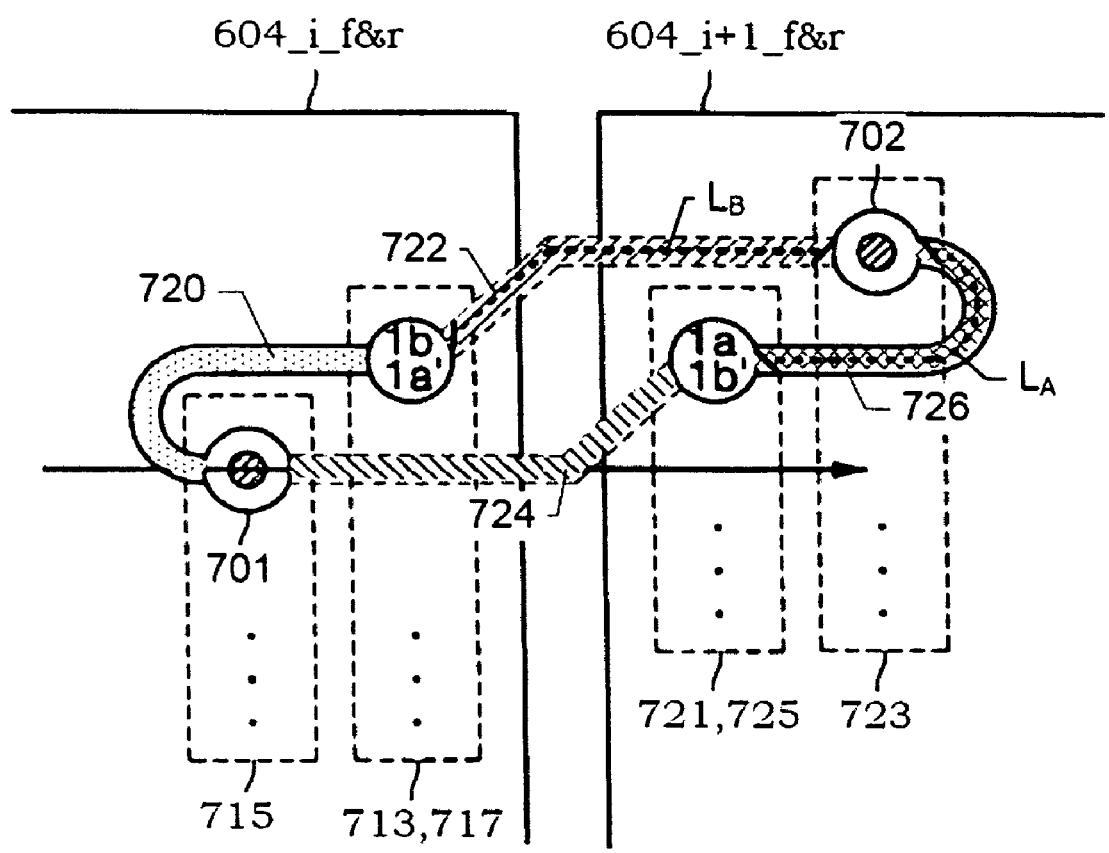
FIG. 7C is a view of a portion of FIG. 7A superimposed on a portion of a flipped version of FIG. 7B.

A fuller understanding of FIGS. 6A & 6C can be facilitated with reference to FIGS. 7A-7C.

FIG. 7A is a front view of the printed wires and vias on a front side 630 of PCB 619 (albeit not depicted in FIG. 7A) in IMM 600 (albeit not depicted in FIG. 7A) with respect to the overlying footprints of memory devices 604_i_f and 604_i+1_f, according to an embodiment of the present invention.
FIG. 7B is a front view of the printed wires and vias on back side 632 of PCB 619 (albeit not depicted in FIG. 7A) in IMM 600 (albeit not depicted in FIG. 7A) with respect to the overlying footprints of memory devices 604_i_r and 604_i+1_r, according to an embodiment of the present invention.

FIG. 7C is a view of a portion of FIG. 7A superimposed on a portion of a flipped version of FIG. 7B, in which the printed wires and vias of PCB 619 (albeit not depicted in FIG. 7A) in IMM 600 (albeit not depicted in FIG. 7A) that fall within the overlapped footprints of positional-twin pairs 604_i_f&r (comprised of memory devices 604_i_f & 604_i_r) and 604_i+1_f&r (comprised of memory devices 604_i+1_f & 604_i+1_r).

FIGS. 7A-7C (again) are provided to enhance understanding of FIGS. 6A-6C. A description of how FIG. 7C is obtained can be as follows: rotate FIG. 7B 180° about a flip axis 724; and then superimpose FIG. 7A upon the rotated version of FIG. 7B.

In FIG. 7C, vias 701 and 702 can connect wires 720 & 724 and 722 & 726, respectively. Pads 1a and 1b' (or, in other words, end portions) of wires 726 and 724, respectively, are not electrically connected, but they do overlap (again, given the relationship of FIG. 7C to FIGS. 7A-7B). Hence, in FIG. 7C, one circle encloses both reference numbers 1a and 1b'. Similarly, pads 1a' and 1b of wires 722 and 720, respectively, are not electrically connected, but they do overlap. Accordingly, in FIG. 7C, one circle encloses both reference numbers 1a' and 1b.

It is noted that all of the statements made above apply regarding FIGS. 6A-6C and 7A-7C apply to most of memory devices 301-318. But there can be exceptions; it is to be recalled that stubs 320_11_k, 320_18_k, 320_01k and 320_10_k of FIG. 3 can be considered as unpaired stubs; see the discussion of stubs 420_11_k, 420_18_k, 420_01_k and 420_10_k above.

In addition to vias 608_m_k discussed above, FIG. 6B also depicts an additional column 640 of vias located within the footprint of memory device 310 and an additional column 642 of vias located within the footprint of memory device 318. Column 640 includes vias 608_10'_k. Column 642 includes vias 608_18'_k. More particularly, the vias in columns 640 and 642 have been moved inward from peripheral signal pads of the respective memory devices 310 and 318, as opposed to being adjacent thereto as continuation of the pattern established relative to memory devices 302-308 and 312-316 might suggest, respectively. Such inward locations can, e.g., reduce a length of the unpaired stubs, respectively.

Other alignments between the first and second set of arrays of memory devices on the opposite sides of PCB are contemplated. For example, consider FIG. 8.

Figure 8:
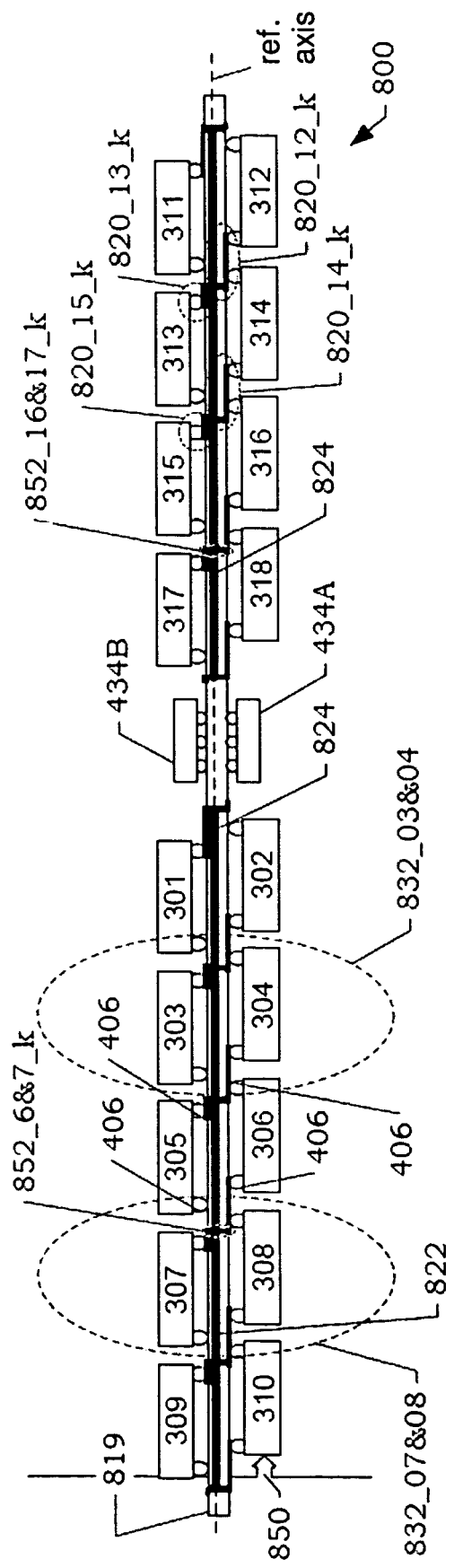
FIG. 8 is a cross-section of an IMM, according to another embodiment of the present invention, where the section line (not depicted) is similar to the section line depicted in FIGS. 1A & 1B.

FIG. 8 is a cross-section of an IMM 800, e.g., a DIMM of any of the various varieties thereof, according to an embodiment of the present invention, where the section line (not depicted) is similar to the section line depicted in FIGS. 1A & 1B. The IMM 800 can be an example of IMM 300.

FIG. 8 is similar in many respects to FIGS. 4A-4C. The IMM 800 can be, e.g., a DIMM of any of the various varieties thereof.

In FIG. 8, IMM 800 includes: a printed circuit board (PCB) 819; and integrated circuit memory devices 301-318. Even numbered memory devices 302-318 represent a first array of memory devices on a first side of PCB 819. Odd numbered memory devices 301-311 represent a second array of memory devices on a second side of PCB 819. Conductive terminals 406 e.g., conductive balls, as I/O terminals of the memory devices can connect conductive I/O terminals of the circuits (not shown) in memory devices 301-318 to the various wires on PCB 819, respectively. The IMM 800 further can include buffer or register devices 434A and 434B.

Relative to a reference axis, e.g., the longitudinal axis of PCB 819, the memory devices in the first array can be described as significantly displaced or shifted relative to the memory devices in the second array, as indicated by the arrow in phantom lines called out by reference number 850. Despite being shifted, however, the memory devices in the first array can be described as substantially overlapping the memory devices in the second array. More specifically, e.g., memory devices 303 & 304 of IMM 800 substantially align relative to a first reference location and yet, e.g., memory device 304 is displaced relative to the first reference location. Similarly, e.g., memory devices 307 & 308 of IMM 800 substantially align relative to a second reference location and yet, e.g., memory device 308 is displaced relative to the second reference location.

Among the plurality of positional-twin pairs depicted in FIG. 8, only two (for the purpose of simplifying illustration) are called out, namely positional-twin pairs 832_03&04 and 832_07&08. Positional twin pair 832_07&08 includes memory devices 307 and 308. Similarly, positional twin pair 832_03&04 includes memory devices 303 and 304. In FIG. 8, at least some of terminals 406 for memory devices 301-318 can be described as being clustered along opposing edges of each such memory device, in a manner similar to what is depicted in FIGS. 1B & 1C.

Also in FIG. 8 (similar to FIG. 3), the cross-section is taken so that the signal path for only one set of common input/output I/O terminals of memory devices 301-318 are represented. Hence, the wires depicted in FIG. 8, namely stubs 820_$i$_$k$ and transmission lines 822 & 824, represent a simplification by which the signal path for only one (hereafter, the $k^{th}$ one) of the common terminals of memory devices 301-318 is depicted.

Even numbered stubs are depicted in FIG. 8 although only stubs 820_12_$k$ and 820_14_$k$ are called out, for simplicity of illustration. Similarly, odd numbered stubs also are depicted in FIG. 8 although only stubs 820_13_$k$ and 820_15_$k$ are called out, for simplicity of illustration.

The vias 852_$m$&m+1_$k$ can be part of a signal path that connects a wire for an $m^{th}$ memory device to a wire for an $m+1^{th}$ memory device. In FIG. 8, the numbering convention for the vias reflects that the vias form a part of the signal path between memory device m and memory device m+1.

Consider, for example, memory devices 306-308 in FIG. 8. The via 852_6&7_$k$ is a part of the signal path that connects a wire for memory device 306 and a wire for memory device 307. It is to be observed that memory device 305 is adjacent (in terms of the reference axis) to memory device 307. The location of via 852_6&7_$k$ can be described as being located in a region defined between terminals 406 (or the underlying portions of the wires connected thereto) of adjacent (in terms of the reference axis) memory devices 307 and 305. That region, in terms of FIG. 8, also can be described in terms of memory devices 307 and 308, namely as being located inward from peripheral terminals 406 (or the underlying portions of the wires connected thereto) of memory device 308 and yet as still being outward of peripheral terminals 406 (or the underlying portions of the wires connected thereto) of memory device 307. It is noted that memory device 308 itself can be described as the positional-twin of memory device 307. Similarly, via 852_17&16_$k$ is a part of the signal path that connects a wire for memory device 317 and a wire for memory device 316.

Alternatively, locations of vias assigned to unpaired stubs in FIG. 8 can be relocated similarly to what is depicted in FIG. 4D (relative to FIGS. 4A-4C).

Figure 9:
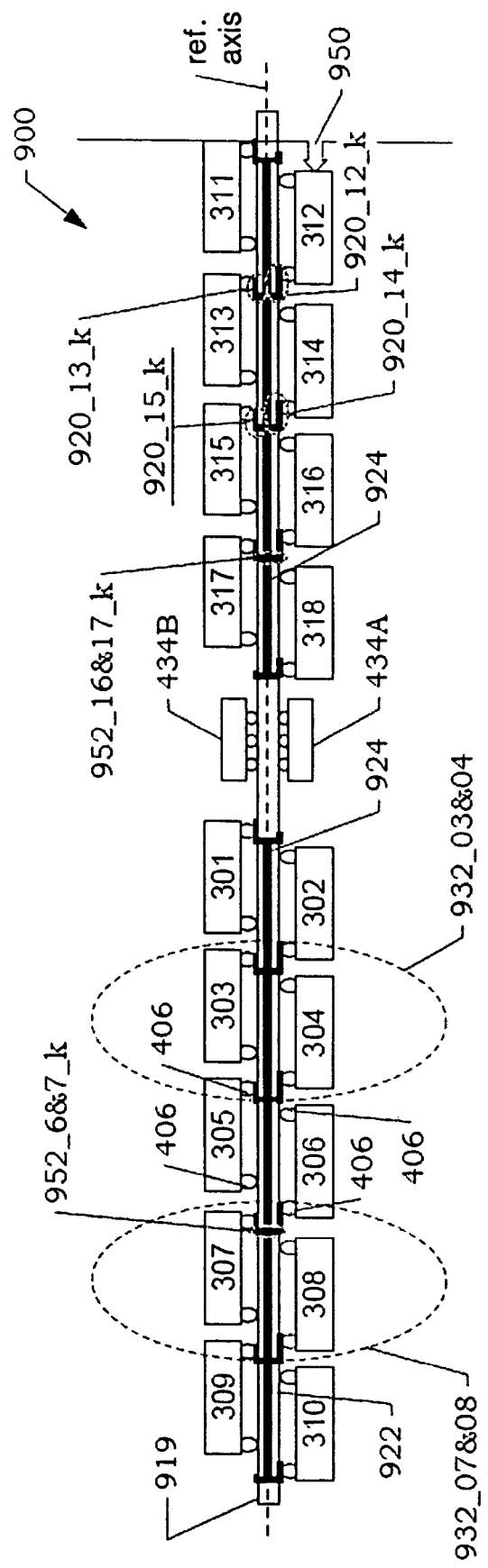
FIG. 9 is a cross-section of an IMM, according to another embodiment of the present invention, where the section line (not depicted) is similar to the section line depicted in FIGS. 1A & 1B.

FIG. 9 is a cross-section of an IMM 900, according to an embodiment of the present invention, where the section line (not depicted) is similar to the section line depicted in FIGS. 1A & 1B. The IMM 900 can be an example of IMM 300.

FIG. 9 is similar in many respects to FIGS. 6A-6C. The IMM 900 can be, e.g., a DIMM of any of the various varieties thereof.

In FIG. 9, IMM 900 includes: a printed circuit board (PCB) 919; and integrated circuit memory devices 301-318. Even numbered memory devices 302-318 represent a first array of memory devices on a first side of PCB 919. Odd numbered memory devices 301-311 represent a second array of memory devices on a second side of PCB 919. Conductive terminals 406 e.g., conductive balls, as I/O terminals of the memory devices can connect I/O terminals of the circuits (not shown) in memory devices 301-318 to the various wires on PCB 919, respectively. The IMM 900 further can include buffer or register devices 434A and 434B.

Relative to a reference axis, e.g., the longitudinal axis of PCB 919, the memory devices in the first array can be described as significantly displaced or shifted relative to the memory devices in the second array, as indicated by the arrow in phantom lines called out by reference number 950. Despite being shifted, however, the memory devices in the first array can be described as substantially overlapping the memory devices in the second array. More specifically, e.g., memory devices 303 & 304 of IMM 900 substantially align relative to a first reference location and yet, e.g., memory device 304 is displaced relative to the first reference location. Similarly, e.g., memory devices 307 & 308 of IMM 900 substantially align relative to a second reference location and yet, e.g., memory device 308 is displaced relative to the second reference location.

Among the plurality of positional-twin pairs depicted in FIG. 9, only two (for the purpose of simplifying illustration) are called out, namely positional-twin pairs 932_03&04 and 932_07&08. Positional twin pair 932_07&08 includes memory devices 307 and 308. Similarly, positional twin pair 932_03&04 includes memory devices 303 and 304. In FIG. 9, at least some of terminals 406 for memory devices 301-318 can be described as being clustered along opposing edges of each such memory device, in a manner similar to what is depicted in FIGS. 1B & 1C.

Also in FIG. 9 (similar to FIG. 3), the cross-section is taken so that only one set of common input/output I/O terminals of memory devices 301-318 are represented. Hence, the wires depicted in FIG. 9, namely stubs 920_$i$_$k$ and transmission lines 922 & 924, represent a simplification by which only one (hereafter, the $k^{th}$ one) of the common terminals of memory devices 301-318 is depicted.

Even numbered stubs are depicted in FIG. 9 although only stubs 920_12_$k$ and 920_14_$k$ are called out, for simplicity of illustration. Similarly, odd numbered stubs also are depicted in FIG. 9 although only stubs 920_13_$k$ and 920_15_$k$ are called out, for simplicity of illustration.

The vias 952_$m$&m+1_k can be part of a signal path that connects a wire for an $m^{th}$ memory device to a wire for an $m+1^{th}$ memory device. In FIG. 9, the numbering convention for the vias reflects that the vias form a part of the signal path between memory device m and memory device m+1.

Consider, for example, memory devices 306-308 in FIG. 9. The via 952_6&7_$k$ is a part of the signal path that connects a wire for memory device 306 and a wire for memory device 307. It is to be observed that memory device 305 is adjacent (in terms of the reference axis) to memory device 307. It is noted that memory device 308 itself can be described as the positional-twin of memory device 307. Similarly, via 952_17&16__k is a part of the signal path that connects a wire for memory device 317 and a wire for memory device 316.

The location of via 952_6&7__k can be described as being located inward from peripheral terminals 406 (or the underlying portions of the wires connected thereto) of memory device 307. The location of via 952_6&7__k further can be described as being located in a region defined between terminals 406 (or the overlying portions of the wires connected thereto) of adjacent (in terms of the reference axis) memory devices 308 and 306.

Embodiments of the present invention having been thus described, it will be obvious that the same may be varied in many ways. Such variations are not to be regarded as a departure from the spirit and scope of the present invention, and all such modifications are intended to be included within the scope of the present invention.

What is claimed is:

1. An inline memory module (IMM) architecture comprising:
    a printed circuit board (PCB);
    a first array of memory devices on a first side of the PCB;
    a second array of memory devices on a second side of the PCB; and
    a plurality of vias; wherein
    at least some of the memory devices of the first array are arranged so as to substantially overlap, relative to a reference axis of the PCB, positional-twin memory devices of the second array, respectively; and
    at least some of the plurality of vias include:
    a first opening along the first side of the PCB,
    a second opening along the second side of the PCB, and
    at least one signal path that passes through both the first opening and the second opening of the vias and connects I/O terminals of a first memory device in the first array to corresponding I/O terminals of a second memory device in the second array that is adjacent to a third memory device in the second array, where the third memory device is a positional-twin corresponding to the first memory device.

2. The IMM architecture of claim 1, wherein:
    at least some I/O terminals of each memory device are clustered along opposing edges of the memory device; and
    locations for a majority of the vias are in regions defined between I/O terminals at edges of adjacent memory devices of the first array, respectively.

3. The IMM architecture of claim 2, wherein the regions also are defined as being between signal pads at edges of adjacent memory devices of the second array.

4. The IMM architecture of claim 2, wherein the following is true for the majority of the vias:
    the via is located within an area inward from peripheral signal pads of the respective second memory device in the second array.

5. The IMM architecture of claim 2, wherein the adjacent memory devices are considered adjacent relative to the reference axis.

6. The IMM architecture of claim 5, wherein the longitudinal axis of the PCB is the reference axis.

7. The IMM architecture of claim 1, wherein:
    at least some signal pads of each memory device are clustered along opposing edges of the memory device; and
    the first array is arranged relative to the second array so that a fourth memory device in the first array is displaced, along the reference axis, relative to a corresponding positional-twin fifth memory device in the second array such that signal pads at one edge of the fifth memory device align with a region located aside signal pads at one edge of the fourth memory device.

8. The IMM architecture of claim 7, wherein the following is true for a majority of the vias:
    the region is defined between the signal pads at the one edge of the fourth memory device and signal pads at one edge of a sixth memory device in the first array that is adjacent to the fourth memory device.

9. The IMM architecture of claim 1, wherein the following is true for a majority of the memory devices in the first and second arrays:
    the first array is arranged relative to the second array so that a fourth memory device in the first array is displaced, along the reference axis, relative to a corresponding positional-twin fifth memory device in the second array such that the fifth memory device partially overlaps a sixth memory device in the first array that is adjacent to the fourth memory device.

10. The IMM architecture of claim 1, wherein the following is true for a majority of the vias:
    the vias are located, relative to the reference axis, inward from peripheral signal pads of the memory devices of the first array, respectively.

11. The IMM architecture of claim 10, wherein:
    the first array is arranged relative to the second array so that a fourth memory device in the first array is displaced, along the reference axis, relative to a corresponding positional-twin fifth memory device in the second array such that a sixth memory device in the second array adjacent to the fifth memory device partially overlaps the fourth memory device in the first array.

12. The IMM architecture of claim 10, wherein the following is true for a majority of the vias:
    the vias are located, relative to the reference axis, inward from peripheral signal pads of the memory devices of the second array, respectively.

13. The IMM architecture of claim 10, wherein the following is true for a majority of the vias:
    the via is aligned with an area defined between signal pads at edges of the second and third memory devices in the second array.

14. The IMM architecture of claim 1, wherein the IMM architecture is a type of dual IMM (DIMM) architecture.

15. The IMM architecture of claim 1, wherein the following is true for a majority of the vias:
    the signal lead of the given first memory device, for the given signal path that includes the given via, is substantially the same length as the signal lead of the given second memory device.

16. An inline memory module (IMM) architecture comprising:
    printed circuit board (PCB) means;
    a first array of memory devices on a first side of the PCB means;
    a second array of memory devices on a second side of the PCB means; and
    a plurality of via means; wherein
    at least some of the memory devices of the first array are arranged so as to substantially overlap, relative to a reference axis of the PCB means, positional-twin memory devices of the second array, respectively; and
    at least some of the plurality of via means include:
    a first opening along the first side of the PCB means,
    a second opening along the second side of the PCB means, and
    at least one signal path, that passes through both the first and second openings of the via means, for connecting signal leads of a first memory device in the first array to corresponding signal leads of a second memory device in the second array that is adjacent to a third memory device in the second array, where the third memory device is a positional-twin corresponding to the first memory device.

17. The IMM architecture of claim 16, wherein:

at least some signal pads of each memory device are clustered along opposing edges of the memory device; and locations for a majority of the via means are in regions defined between signal pads at edges of adjacent memory devices of the first array, respectively.

18. The IMM architecture of claim 16, wherein the adjacent memory devices are considered adjacent relative to the longitudinal axis of the PCB means.

19. The IMM architecture of claim 16, wherein:

at least some signal pads of each memory device are clustered along opposing edges of the memory device; and the first array is arranged relative to the second array so that a fourth memory device in the first array is displaced, along the reference axis, relative to a corresponding positional-twin fifth memory device in the second array such that signal pads at one edge of the fifth memory device align with a region located aside signal pads at one edge of the fourth memory device.

20. The IMM architecture of claim 16, wherein the following is true for a majority of the memory devices in the first and second arrays:

the first array is arranged relative to the second array so that a fourth memory device in the first array is displaced, along the reference axis, relative to a corresponding positional-twin fifth memory device in the second array such that the fifth memory device partially overlaps a sixth memory device in the first array that is adjacent to the fourth memory device.

* * * * *